(12) United States Patent
Shimanuki et al.

(10) Patent No.: US 8,390,133 B2
(45) Date of Patent: Mar. 5, 2013

(54) SEMICONDUCTOR DEVICE AND MANUFACTURING METHOD THEREOF

(75) Inventors: Yoshihiko Shimanuki, Nanyo (JP); Yoshihiro Suzuki, Yonezawa (JP); Koji Tsuchiya, Kaminoyama (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/534,078

(22) Filed: Jun. 27, 2012

(65) Prior Publication Data

US 2013/0001804 A1    Jan. 3, 2013

Related U.S. Application Data

(63) Continuation of application No. 12/953,499, filed on Nov. 24, 2010, now Pat. No. 8,222,720, which is a continuation of application No. 12/408,890, filed on Mar. 23, 2009, now Pat. No. 7,843,049, which is a continuation of application No. 10/519,785, filed as application No. PCT/JP03/06830 on May 30, 2003, now Pat. No. 7,525,184.

(30) Foreign Application Priority Data

Jul. 1, 2002 (JP) .................................. 2002-191666

(51) Int. Cl.
*H01L 23/48* (2006.01)
*H01L 23/52* (2006.01)
*H01L 29/40* (2006.01)

(52) U.S. Cl. ........... 257/782; 257/E33.057; 257/E25.03; 257/E23.061

(58) Field of Classification Search .................. 257/676, 257/677, 678, 711, 731, 733, 782, E39.022, 257/E33.057, E25.03, E23.042, E23.061, 257/E21.499, E21.503, E21.5, E21.51, E21.511, 257/E21.513

See application file for complete search history.

(56) References Cited

U.S. PATENT DOCUMENTS 6,661,081 B2 * 12/2003 Miyaki et al. ................. 257/668
7,843,049 B2   11/2010 Shimanuki et al.

FOREIGN PATENT DOCUMENTS

| JP | 2000-031366 A | 1/2000 |
| JP | 2000-124240 A | 4/2000 |
| JP | 2002-057244 A | 2/2002 |
| JP | 2002-184927 A | 6/2002 |
| WO | WO 01/03186 A1 | 1/2001 |

* cited by examiner

*Primary Examiner* — Calvin Lee
*Assistant Examiner* — Monica D Harrison
(74) *Attorney, Agent, or Firm* — Miles and Stockbridge P.C.

(57) ABSTRACT

There are constituted by a tab on which a semiconductor chip is mounted, a sealing portion formed by resin-sealing the semiconductor chip, a plurality of leads each having a mounted surface exposed to a peripheral portion of a rear surface of the sealing portion and a sealing-portion forming surface disposed on an opposite side thereto, and a wire for connecting a pad of the semiconductor chip and a lead, wherein the length between inner ends of the sealing-portion forming surfaces of the leads disposed so as to oppose to each other is formed to be larger than the length between inner ends of the mounted surfaces. Thereby, a chip mounting region surrounded by the inner end of the sealing-portion forming surface of each lead can be expanded and the size of the mountable chip is increased.

9 Claims, 36 Drawing Sheets

SEMICONDUCTOR DEVICE AND MANUFACTURING METHOD THEREOF

CROSS-REFERENCE TO RELATED APPLICATION

This application is a continuation of application Ser. No. 12/953,499 filed Nov. 24, 2010 now U.S. Pat. No. 8,222,720, which is a continuation of application Ser. No. 12/408,890 filed Mar. 23, 2009 (now U.S. Pat. No. 7,843,049 issued Nov. 30, 2010), which is a continuation of application Ser. No. 10/519,785 filed Sep. 6, 2005 (now U.S. Pat. No. 7,525,184 issued Apr. 28, 2009), which is a 371 of International Patent Application No. PCT/JP2003/006830 filed May 30, 2003.

TECHNICAL FIELD OF THE INVENTION

The present invention relates to a semiconductor manufacturing technique and particularly to a technique effectively applied to enlargement of the size of a chip to be mountable.

BACKGROUND OF THE INVENTION

As a semiconductor device intended to be downsized, a small semiconductor package slightly larger in size than a semiconductor chip, which is called a QFN (Quad Flat Non-leaded Package), has been developed and the semiconductor package, having such a structure that a plurality of leads to be external terminals are disposed on a peripheral portion of a rear face of a sealing portion formed by a resin mold, is called a peripheral type.

In the QFN, since the respective leads are exposed to the rear face of the sealing portion, bonding regions between the respective leads and a sealing resin are very small, so that various devices for increasing a bonding strength between each lead and the sealing portion have been made.

Note that the structure of the QFN is described in, for example, "Monthly Semiconductor World Special Edition '99, Semiconductor Assembly/Inspection Technology", pp. 53-57, published by Kabushiki Kaisha Press Journal, on Jul. 27, 1998.

In the QFN, as shown in a comparative example of FIG. 14, the extending length (P) of a mounted surface 1d, which is exposed to a rear surface 3a of a sealing portion 3 of each lead 1a and functions as an external terminal, has the relation "Q≧P" in comparison with the length (Q) of a sealing-portion forming surface 1g that is located on an opposite side thereof and covered with a resin sealing portion.

This is because, on a sealing-portion forming surface 1g of each lead 1a, there are formed a plurality of concave portions 1m, which prevents exertion of a stress to a wire bonding portion at a time of cutting the lead and increases a pulling strength of each lead with respect to a horizontal direction, whereby the length (Q) of the sealing-portion forming surface 1g is larger and consequently the relation "Q≧P" is formed.

When it is intended to mount a larger semiconductor chip without changing the package size in accordance with demands etc. from a customer under the above condition, the extending length (P) of the mounted surface 1d cannot be shortened in view of the fixed package size since the length (P) is defined per package size based on EIJA standards (Standards of Electronic Industries Association of Japan).

Accordingly, it becomes a problem that mounting of the larger semiconductor chip cannot be achieved without changing the package size.

An object of the present invention is to provide a semiconductor device in which mountable chip size is increased and to provide a manufacturing method thereof.

The above and other objects and novel features of the present invention will become apparent from a description of the specification and the accompanying drawings.

DISCLOSURE OF THE INVENTION

That is, the present invention comprises: a tab on which a semiconductor chip is mounted; a sealing portion for sealing said semiconductor chip; a plurality of leads each having a mounted surface exposed to a peripheral portion of a rear surface of said sealing portion, and a sealing-portion forming surface disposed on an opposite side to the mounted surface and contacting with a side surface of said sealing portion; and a plurality of wires for connecting surface electrodes of said semiconductor chip and said leads corresponding thereto, wherein a length between inner ends of said sealing-portion forming surfaces of said leads disposed to oppose to each other is longer than a length between inner ends of said mounted surfaces.

Also, the present invention comprises the steps of: preparing a lead frame having a tab capable of supporting a semiconductor chip and a plurality of leads disposed around said tab, wherein a length between inner ends of sealing-portion forming surfaces of said leads disposed to oppose to each other is larger than a length between inner ends of mounted faces located on an opposite side thereto; disposing said semiconductor chip within a region surrounded by an inner end of said sealing-portion forming surface of each of said plurality of leads, and thereafter mounting said semiconductor chip on said tab; connecting surface electrodes of said semiconductor chip and said leads corresponding thereto by wires; forming a sealing portion that the mounted surfaces of said plurality of leads are exposed to and arranged on a peripheral portion of a rear surface by resin-sealing said semiconductor chip and said wire; and cutting each of said leads and separating it from said lead frame.

BEST MODE FOR CARRYING OUT THE INVENTION

Figure 1:
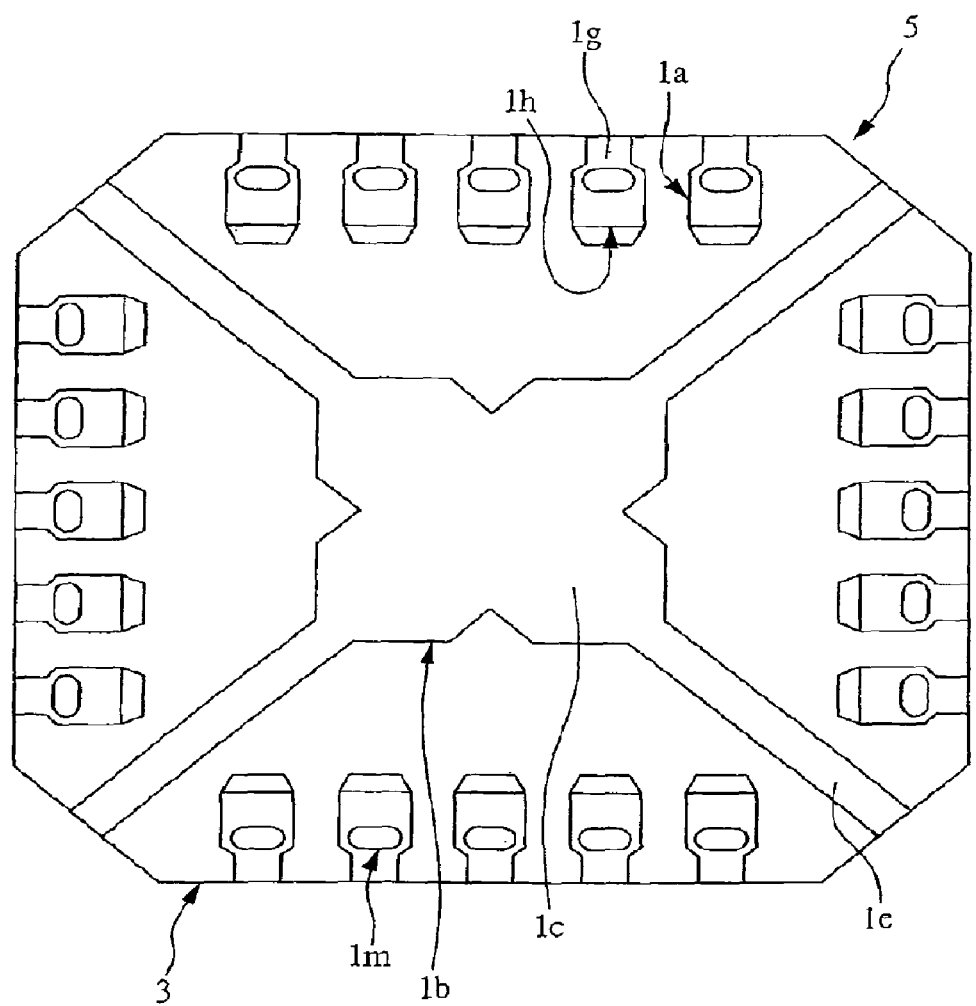
FIG. 1 is a plan view showing one example of a frame structure as seen through a sealing portion in a structure of a semiconductor device (QFN) according to a first embodiment of the present invention.

Hereinafter, embodiments of the present invention will be detailed based on the drawings.

In the following embodiments, the invention will be described in a plurality of sections or embodiments when required as a matter of convenience. However, these sections or embodiments are not irrelevant to each other unless otherwise stated, and the one relates to the entire or a part of the other as a modification example, details, a supplementary explanation or the like thereof.

Also, in the embodiments described below, when referring to the number of elements (including number of pieces, values, amounts, ranges, or the like), the number of elements is not limited to a specific number unless otherwise stated, or except the case where the number is apparently limited to a specific number in principle, or the like. The number larger or smaller than the specified number is also applicable.

Note that, throughout all the drawings for describing the embodiments, members having the same function are denoted by the same reference numeral and a repetitive description thereof will be omitted.

First Embodiment

Figure 2:
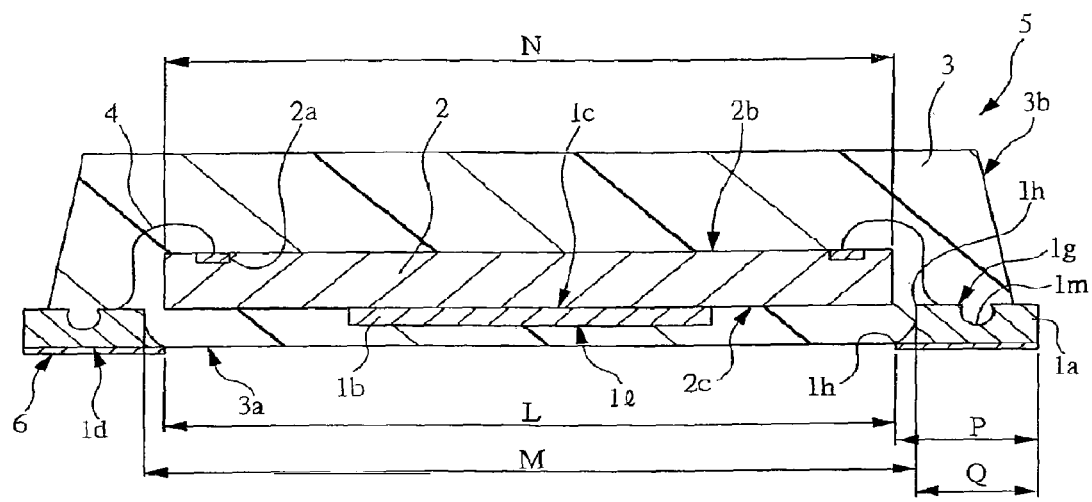
FIG. 2 is a sectional view showing the structure of the QFN shown in FIG. 1.
Figure 7:
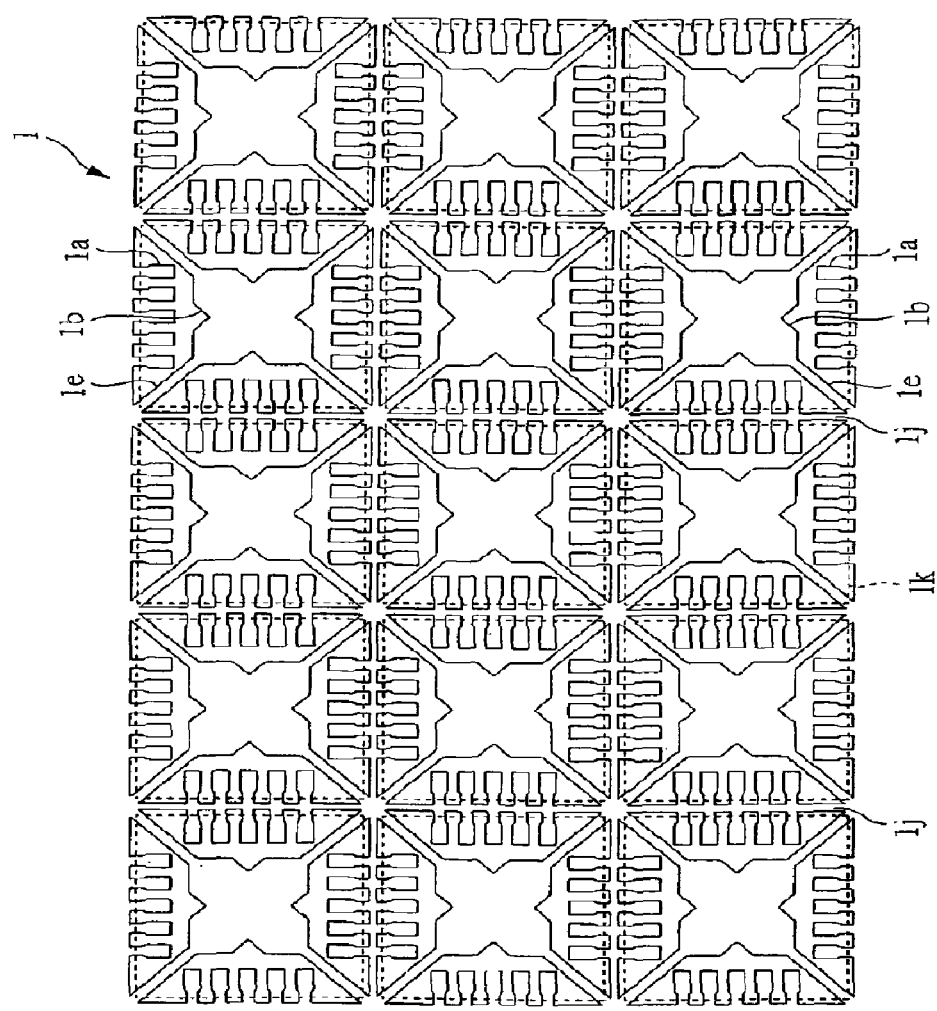
FIG. 7 is a partial plan view showing one example of a structure of a lead frame used for assembly of the QFN shown in FIG. 1.

A semiconductor device according to a first embodiment shown in FIGS. 1 and 2 is a small semiconductor package, which is assembled using a lead frame shown in FIG. 7 and is a single-surface-molding resin sealing type in which a sealing portion 3 is formed on a single-surface side of a lead frame 1 by resin molding, and it is further a peripheral type in which mounted surfaces 1d of a plurality of leads 1a are exposed to and arranged on a peripheral portion of a rear surface 3a of the sealing portion 3, and, as an example of said semiconductor device, a QFN 5 is taken and will be described.

Therefore, each lead 1a of the QFN5 functions as both an inner lead embedded in the sealing portion 3 and an outer lead exposed to the peripheral portion of the rear surface 3a of the sealing portion 3.

Note that, in the QFN 5 shown in FIG. 2, a tab 1b, which is a chip mounting portion, is formed to have about half thickness of that of the lead 1a since its rear surface 1l is scraped by a process such as half etching, and thereby a sealing resin flows also on a side of the rear surface 1l of the tab 1b and resin molding is made. That is, although the QFN 5 has a tab embedding structure in which the tab 1b is embedded in the sealing portion 3, it may have a tab exposing structure in which the rear surface 1l of the tab 1b is exposed to a rear surface 3a of the sealing portion 3.

Further, although the QFN 5 has a tab structure in which the tab 1b is smaller in size than the semiconductor chip 2, the QFN 5 is not limited to the above small tab structure and may have a structure in which the tab 1b is equal to or larger than the semiconductor chip 2 in size.

The structure of the QFN 5 shown in FIGS. 1 and 2 will be described. It comprises: a tab 1b that has a chip supporting surface 1c for supporting the semiconductor chip 2 and in which the semiconductor chip 2 is mounted on the chip supporting surface 1c; a sealing portion 3 formed by resin-sealing the semiconductor chip 2; a tab hanging lead 1e for supporting the tab 1b; a plurality of leads 1a each having the mounted surface 1d exposed to the peripheral portion of the rear surface 3a of the sealing portion 3 and the sealing-portion forming surface 1g disposed on an opposite side thereof and contacting with a side surface 3b of the sealing portion 3; and a plurality of wires 4 connecting pads 2a serving as surface electrodes of the semiconductor chip 2 and the leads 1a corresponding thereto, wherein it is formed so that the length (M) between inner ends 1h of the sealing-portion forming faces 1g of the leads 1a disposed to oppose each other among the plurality of leads 1a is larger than the length (L) between inner ends of the mounted surfaces 1d.

That is, as shown in FIG. 2, the respective leads 1a are formed so that the length (M)>the length (L) between the leads 1a opposed to each other.

Further, the respective leads 1a are such that "the length (Q) of the sealing-portion forming surface 1g"<"the length (P) of the mounted surface 1d" is formed.

Therefore, it is possible to expand each chip mounting region surrounded and formed by the inner ends 1h of the sealing-portion forming surfaces 1g of the respective leads 1a and consequently to achieve enlargement of the mountable chip size without changing the package size.

Therefore, the larger semiconductor chip 2 can be mounted.

Figure 14:
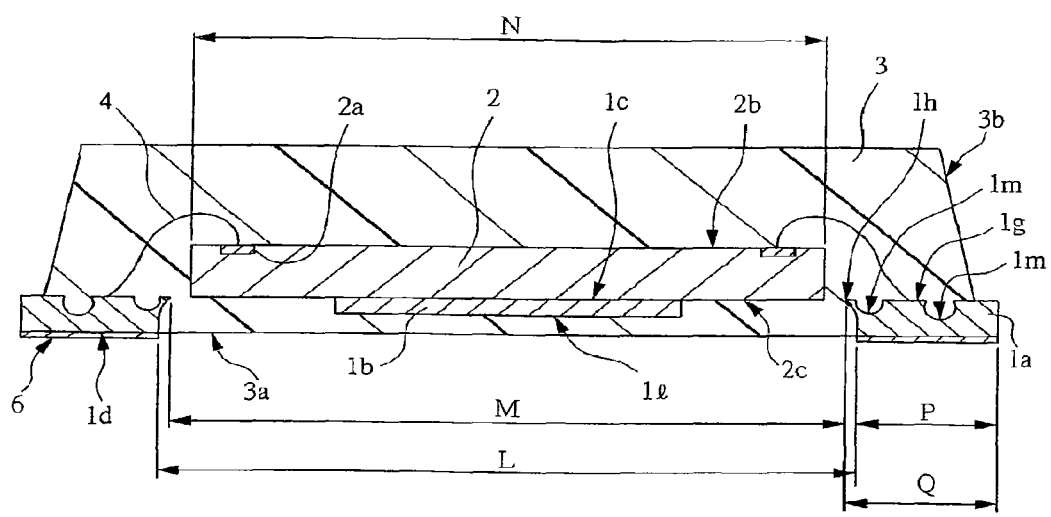
FIG. 14 is a sectional view showing a structure of a QFN, which is a comparative example with respect to a QFN according to a first embodiment of the present invention.

Here, the maximum values of the mountable chip size are compared between the QFN 5 according to the first embodiment shown in FIG. 2 and a QFN type semiconductor device that is a comparative example shown in FIG. 14. Firstly, in the QFN type semiconductor device that is the comparative example shown in FIG. 14, if it is assumed that the length (L) between the inner ends 1h of the mounted surfaces 1d of the leads 1a disposed to oppose to each other is 3 mm, the length (M) between the inner ends 1h of the sealing-portion forming surfaces 1g is 2.9 mm. In view of mounting accuracy of a die bonder, a margin of 0.1 mm from an edge of the semiconductor chip 2 is necessary and the maximum value (N) of the mountable chip size becomes 2.7 mm (2.7 mm×2.7 mm) by calculating "the length (M)−0.2 mm".

In contrast, in the case of the QFN 5 of the present embodiment shown in FIG. 2, if it is assumed that the package size is the same and the length (L) between the inner ends 1h of the mounted surfaces 1d of the leads 1a disposed to oppose to each other is similarly 3 mm, the length (M) between the inner ends 1h of the sealing-portion forming surfaces 1g is 3.2 mm. Consequently, the maximum value (N) of the mountable chip size becomes 3.0 mm (3.0 mm×3.0 mm).

Thus, even if the package size is the same, the QFN 5 shown in FIG. 2 in the present embodiment can mount the semiconductor chip 2 larger in size than the QFN type semiconductor device that is the comparative example shown in FIG. 14.

Also, in the QFN 5 of the present embodiment shown in FIG. 2, since the chip mounting region surrounded and formed by the inner ends 1h of the sealing-portion forming surfaces 1g of the respective leads 1a can be expanded, the bonding accuracy at a time of die bonding can be reduced.

Further, the inner ends 1h on sides of the sealing-portion forming surfaces 1g of the leads 1a are located more apart from the semiconductor 2 than the inner ends 1h on sides of the mounted surfaces 1d. Therefore, in the case of mounting the large semiconductor chip 2, even if a vertical deviation of the chip occurs due to resin injection pressure, it is possible to prevent the leads 1a and the semiconductor chip 2 from contacting with one another and to reduce damage to the chip.

Figure 4:
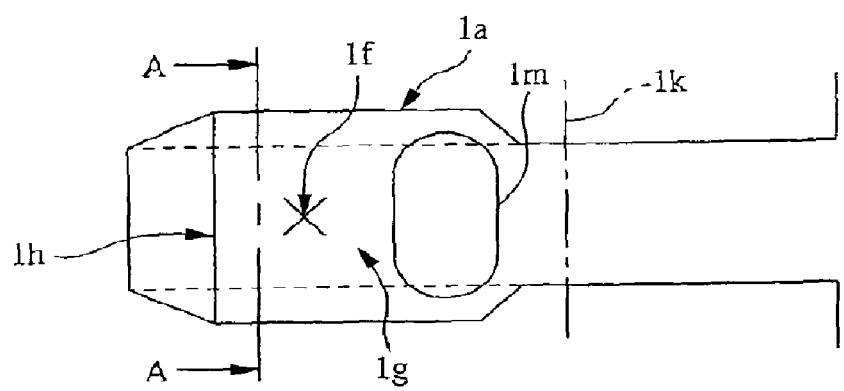
FIG. 4 is an enlarged partial plan view of the lead shown in FIG. 3.
Figure 5:
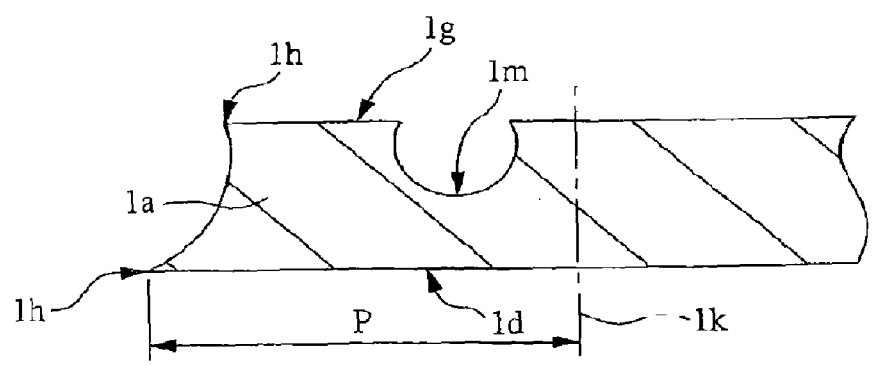
FIG. 5 is an enlarged partial sectional view of the lead shown in FIG. 3.

Note that, in the QFN 5 shown in FIG. 2, as shown in FIGS. 4 and 5, one concave portion 1m is formed in a region that is outside a bonding point 1f and inside a molding line 1k of each lead 1a.

This concave portion 1m is a place to which, when a stress occurring at a time of cutting out the lead during a lead cutting process is exerted on the lead 1a, the stress is applied. Since the concave portion 1m is formed, the stress can be prevented from being applied to a wire bonding portion and disconnection of the wires 4 can be prevented at a time of cutting out the lead 1a.

Further, since the concave portion 1m is formed, the pulling strength of the lead 1a with respect to a horizontal direction of the package can be improved.

Figure 3:
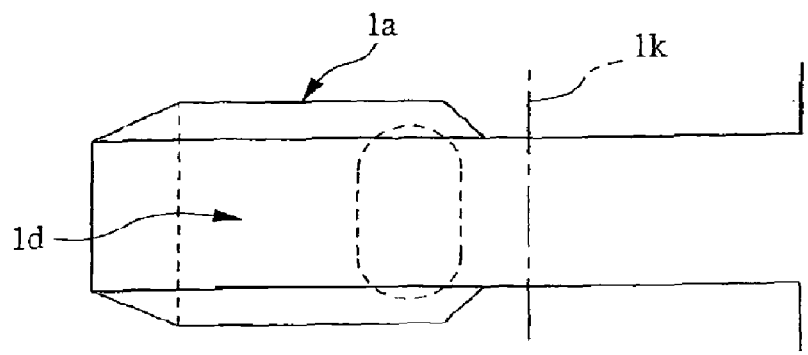
FIG. 3 is an enlarged partial bottom view showing a lead structure of a lead frame used for assembly of the QFN shown in FIG. 1.
Figure 6:
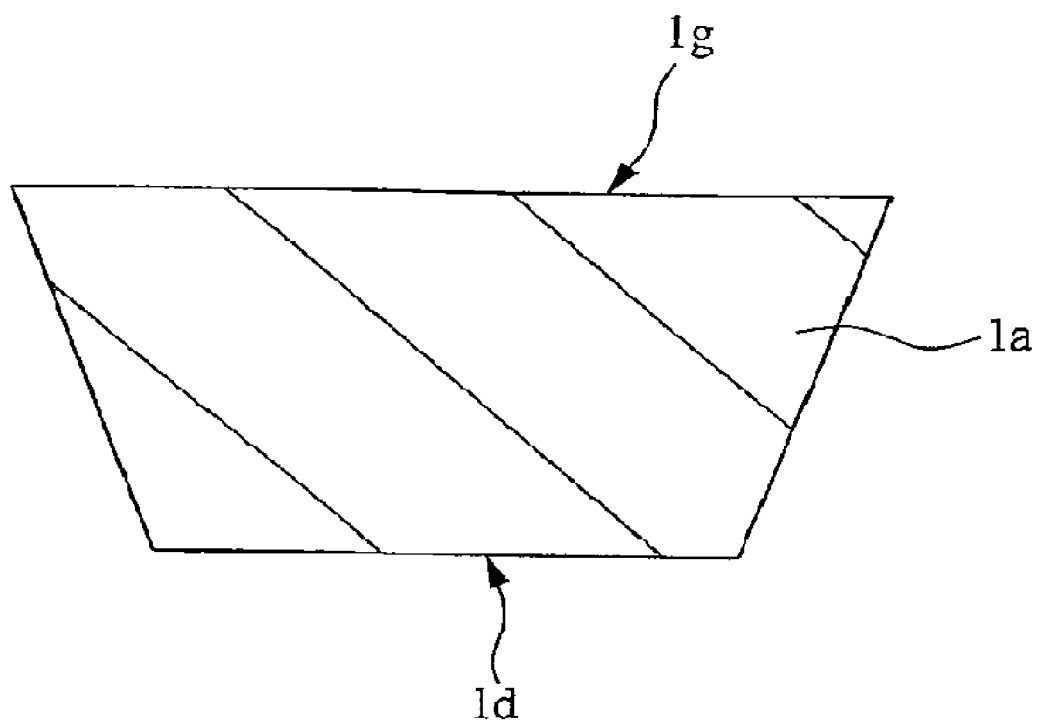
FIG. 6 is a sectional view taken along line A-A of the lead shown in FIG. 4.

Also, in the QFN 5 shown in FIG. 2, as shown in FIGS. 3, 4, and 6, at least one portion of the sealing-portion forming surface 1g is formed larger in width than the mounted face 1d. That is, as shown in FIG. 6, the sealing-portion forming surface 1g formed on an upper side is formed larger in width than the mounted surface 1d disposed on a lower side and the lead is formed into an inverted trapezoidal shape in a thickness direction thereof.

Thereby, a pulling strength of the lead 1a in a package-vertical direction can be improved.

Also, as shown in FIG. 2, the semiconductor chip 2 is fixed on the chip supporting surface 1c of the tab 1b by a die bond material (e.g., silver paste etc.).

Further, a solder plating layer 6 having a thickness of approximately 10 μm is formed on the mounted surface 1d of each of the leads 1a, which are external terminals disposed in parallel on the peripheral portion of the rear surface 3a of the sealing portion 3 of the QFN 5.

Also, the tab 1b, the tab hanging lead 1e, and the respective leads 1a are formed of thin-sheet materials of copper etc. and their thickness is approximately 0.15 to 0.2 mm.

Further, the wires 4 for connecting the pads 2a of the semiconductor chip 2 and the leads 1a corresponding thereto are made of, for example, gold etc.

Also, the sealing portion 3 is formed by resin-sealing in a molding method, and a sealing resin used in its formation is, for example, a thermoplastic epoxy resin etc.

Next, a method of manufacturing the GFN 5 (semiconductor device) according to the first embodiment will be described.

Firstly, there is prepared a lead frame 1 shown in FIG. 7, which comprises the tab 1b capable of supporting the semiconductor chip 2, the tab hanging lead 1e for supporting the tab 1b, and the plurality of leads 1a disposed around the tab 1b, wherein the length between the inner ends 1h of the sealing-portion forming surfaces 1g of the leads 1a disposed to oppose to each other is formed larger than the length between the inner ends 1h of the mounted surfaces 1d.

That is, as shown in FIG. 2, there is prepared the lead frame 1 in which the respective leads 1a are such that "the length (Q) of each sealing-portion forming surface 1g"≦"the length (P) of the mounted surface 1d" is formed.

Also, as shown in FIG. 7, cutting portions for sectioning the tab 1b and the leads 1a disposed on a periphery thereof are formed on the lead frame 1. Note that dotted lines in FIG. 7 indicate mold lines 1k after molding.

Further, the lead frame 1 is a strip-shaped multiple one capable of manufacturing the plurality of QFNs 5 from one sheet of lead frame 1. Further, the QFNs 5 can be manufactured in matrix arrangement on one sheet of lead frame 1. Thus, a plurality of package regions, each of which corresponds to one QFN 5, are formed in matrix arrangement on one sheet of lead frame 1.

Also, the lead frame 1 is made of, for example, a thin-sheet material of copper (Cu) etc. and its thickness is approximately 0.15 to 0.2 mm. However, the above-mentioned material and the above-mentioned thickness, etc. are not limited to this example.

Thereafter, the semiconductor chip 2 in which a semiconductor integrated circuit is formed on a main surface 2a thereof is prepared, and the semiconductor chip 2 is disposed on the tab 1b within a region surrounded by the inner end 1h of each sealing-portion forming surface 1g of the plurality of leads 1a.

Thereafter, die bonding (called also pellet bonding or chip mounting) for joining the rear surface 2c of this semiconductor chip 2 and the chip supporting surface 1c of the tab 1b is performed.

That is, the semiconductor chip 2 is mounted on the chip supporting surface 1c of the tab 1b of the lead frame 1.

At this time, the semiconductor chip 2 is fixed to the tab 1b of the lead frame 1 through a die bonding material (e.g., silver paste etc.) so that the main surface 2b is faced upward.

Subsequently, as shown in FIG. 2, the pad 2a of the semiconductor chip 2 is connected, by wire bonding that utilizes the wire 4 for bonding, to a vicinity of the bonding point 1f on the sealing-portion forming face 1g of the lead 1a which is shown in FIG. 4 and corresponds to the above pad.

Thereafter, the semiconductor chip 2 and the plurality of wires 4 are resin-sealed by the resin molding (in this case, transfer molding) to form the sealing portion 3 on a side of the sealing-portion forming surface 1g of the lead frame 1 (single-surface molding is carried out).

At this time, the resin molding is executed so that the mounted faces 1d of the plurality of leads 1a are exposed to and arranged on the peripheral portion of the rear surface 3a of the sealing portion 3.

In this case, the resin molding is carried out using a molding die 8 of a single-piece molding type, in which a cavity 8c of the molding die 8 (see FIG. 35) corresponds to the QFN 5 one to one.

Consequently, the plurality of sealing portions 3 are formed on the lead frame 1 in matrix arrangement.

Thereafter, there is performed lead cutting (separation to individual pieces) in which the respective leads 1a and tab hanging leads 1e projecting from the sealing portion 3 are cut out and separated from the lead frame 1.

In this case, the respective leads 1a are cut out along the cutting portion 1j of the lead frame 1 to obtain the QFN 5 shown in FIG. 2.

Next, a QFN 5 that is a modified example of the first embodiment will be described.

Figure 8:
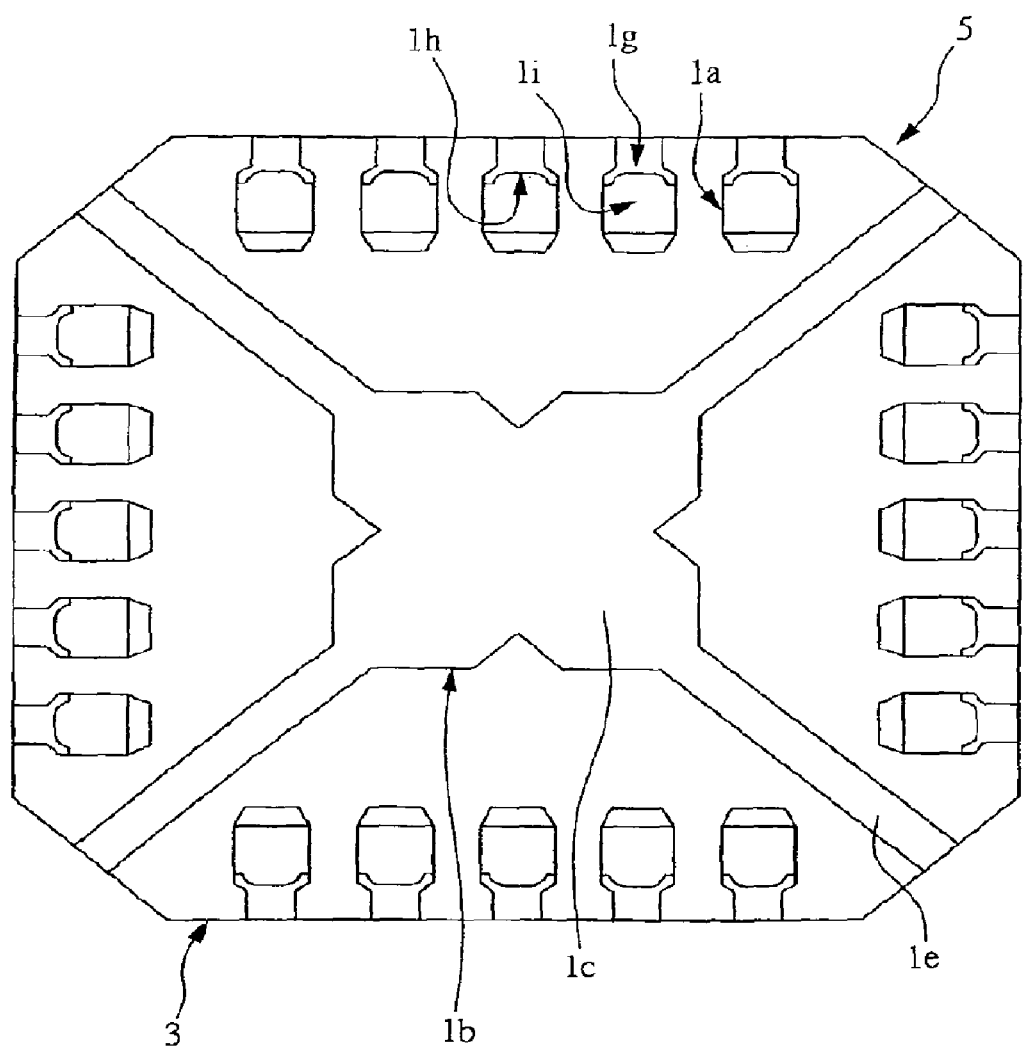
FIG. 8 is a plan view showing a frame structure as seen through a sealing portion in a semiconductor device (QFN) that is a modified example of a first embodiment of the present invention.
Figure 9:
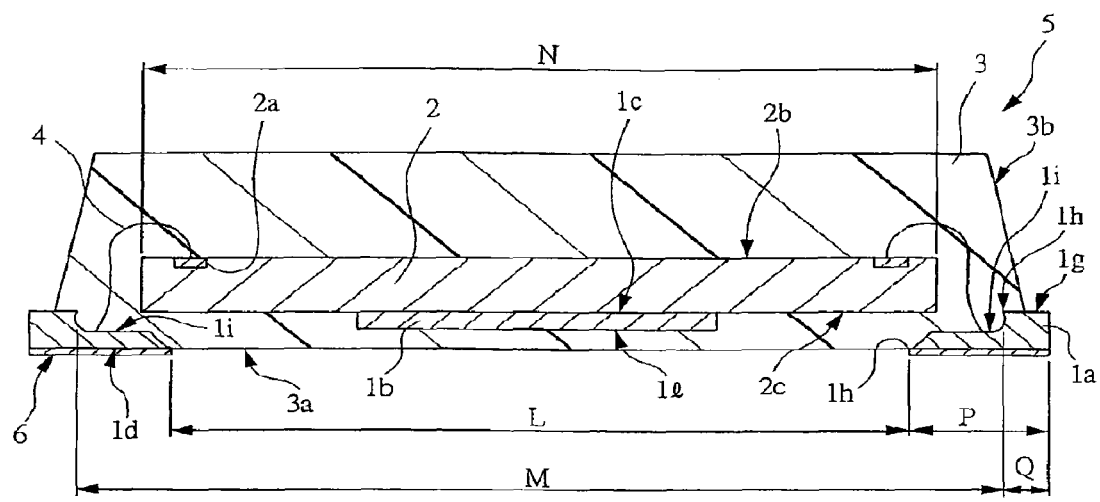
FIG. 9 is a sectional view showing the structure of the QFN shown in FIG. 8.
Figure 10:
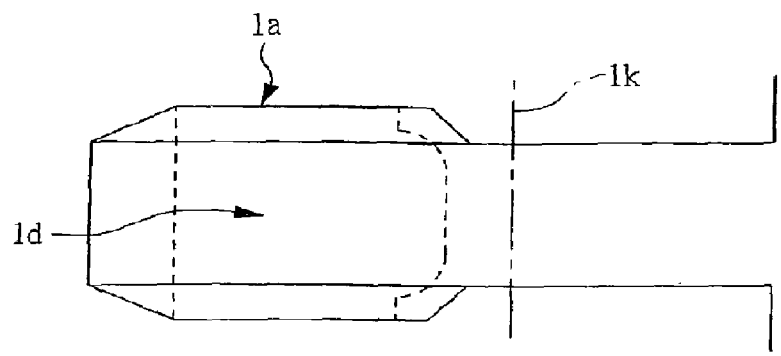
FIG. 10 is an enlarged partial bottom view showing a lead structure of a lead frame used for assembly of the QFN shown in FIG. 8.
Figure 11:
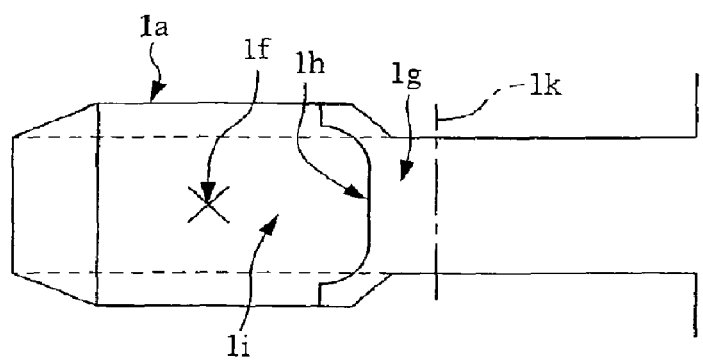
FIG. 11 is an enlarged partial plan view of the lead shown in FIG. 10.
Figure 12:
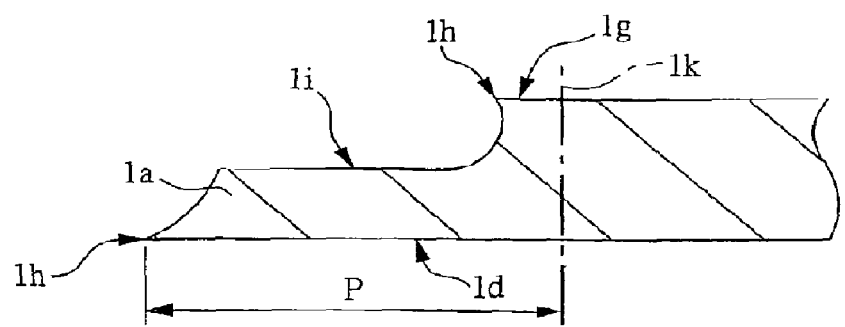
FIG. 12 is an enlarged partial sectional view of the lead shown in FIG. 11.

FIGS. 8 and 9 show the QFN 5 that is the modified example and also FIGS. 10 to 12 show the shape of each lead 1a of the QFN 5 that is the modified example.

That is, although the QFN 5 shown in FIGS. 8 and 9 has substantially the same structure as the QFN 5 shown in FIG. 2, a difference between them is the shape of the sealing-portion forming surface 1g of each lead 1a and is the point that a notch portion 1i as shown in FIG. 12 is formed in the inner end 1h of the sealing-portion forming surface 1g of each lead 1a.

That is, the notch portion 1i having a step portion which is lower in height than the sealing-portion forming surface 1g is provided in an inner corner portion of the sealing-portion forming surface 1g of each lead 1a.

By providing this notch portion 1i, the length (M) between the inner ends 1h of the sealing-portion forming surfaces 1g of the leads 1a disposed to oppose to each other is larger than the length (L) between the inner ends 1h of the mounted surfaces 1d, and, similarly to the QFN 5 shown in FIG. 2, each lead 1a is such that "the length (Q) of the sealing-portion forming surface 1g"<"the length (P) of the mounted surface 1d".

Note that, in the QFN 5 that is a modified example shown in FIG. 9, the wire 4 is connected to the notch portion 1i which is lowered one step from the sealing-portion forming surface 1g of each lead 1a.

Figure 13:
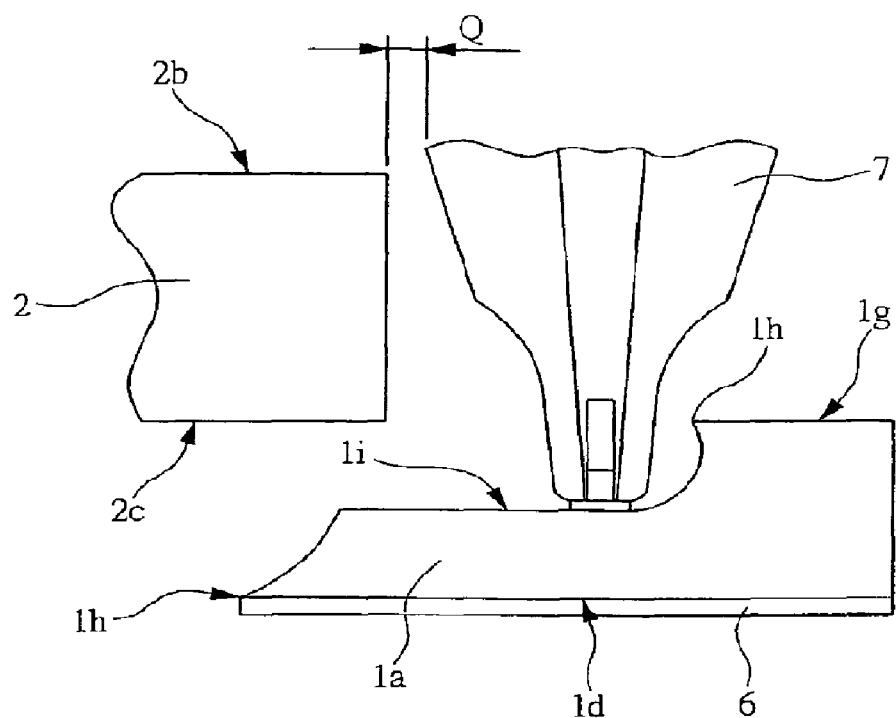
FIG. 13 is a partial side view showing one example of a gap between a semiconductor chip and a capillary at a time of wire bonding in assembly of the QFN shown in FIG. 8.

Therefore, as shown in FIG. 13, it is necessary to set size of a mountable chip in view of an interval (Q) between an end portion of the semiconductor chip 2 and a capillary 7 serving as a bonding tool so that the capillary 7 can enter the notch portion 1i of the lead 1a at the time of wire bonding.

For example, by making the QFN 5 shown in FIG. 2 coincide with the package size and in view of the above-mentioned interval (Q) (e.g., Q=approximately 0.05 mm), the mountable size is calculated. Firstly, as shown in FIG. 9, if the length (L) between the inner ends 1h of the mounted surfaces 1d of the respective leads 1a disposed to oppose to each other is set to 3 mm similarly thereto, the length (M) between the inner ends 1h of the sealing-portion forming surfaces 1g is 3.84. In view of mounting accuracy of the die bonder and bondability of the wire bonding, for example, a margin of 0.32 mm from the edge of the semiconductor chip 2 is necessary and the maximum value (N) of the mountable chip size becomes 3.2 mm (3.2 mm×3.2 mm) by calculating "the length (M)−0.64".

In this case, since the notch portion 1*i* is formed in each inner end 1*h* of the sealing-portion forming surfaces 1*g* of the leads 1*a*, the semiconductor chip 2 much larger in size than the QFN 5 shown in FIG. 2 can be mounted.

Note that since the other structure and assembly method and the other operation and effects of the modified example shown in FIG. 9 are the same as those of the QFN 5 shown in FIG. 2, the duplicated description thereof is omitted.

Second Embodiment

In a second embodiment, a QFN 9 having substantially the same structure as the QFN 5 described in the first embodiment will be described.

Figure 15:
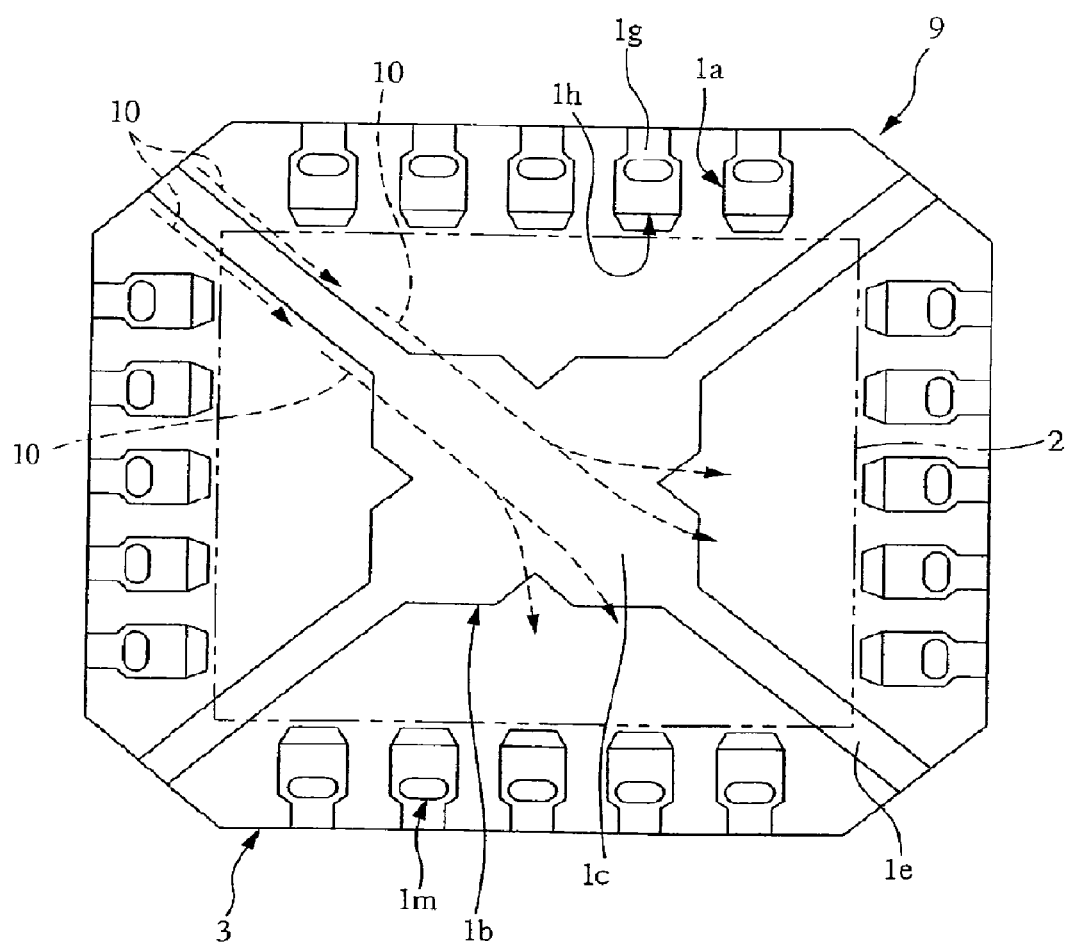
FIG. 15 is a plan view showing one example of a flow state of a sealing resin in a QFN according to a second embodiment of the present invention.
Figure 16:
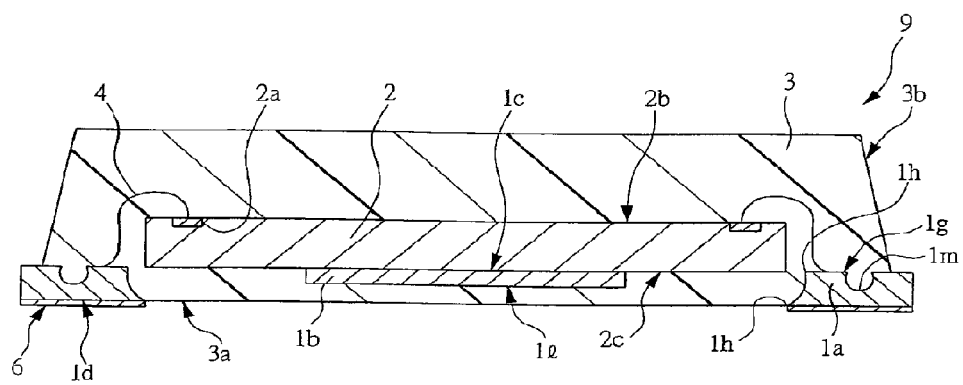
FIG. 16 is a sectional view showing the structure of the QFN shown in FIG. 15.

FIG. 15 shows a QFN 9 having a small tab structure in which the tab 1*b* shown in FIG. 16 is formed smaller in size than the main surface 2*b* of the semiconductor chip 2 and a tab embedding structure in which a portion of the sealing portion 3 is disposed on a side of the rear surface 1*l* of the tab 1*b*, wherein there is shown a flow condition of a resin (sealing resin) at a time of assembly of the QFN 9. That is, when the chip size increases, it becomes difficult for the sealing resin to enter a region between a side surface of the tab 1*b* and each lead 1*a* on a side of the rear surface 2*c* of the semiconductor chip 2, in the QFN 9 of the second embodiment. However, in the QFN 9 of the second embodiment, as shown in FIG. 16, the rear surface 1*l* of the tab 1*b* is processed to become thin by half etching etc., so that the sealing resin is made to intrude also into the side of the rear surface 1*l* of the tab 1*b* at a time of the resin molding.

Therefore, the sealing resin flows along resin flow directions shown in FIG. 15 on the side of the rear surface 1*l* of the tab 1*b* and, consequently, it is possible to introduce the sealing resin around and into the region between the side surface of the tab 1*b* and each lead 1*a* on the rear surface of the chip and to prevent voids from occurring in the above-mentioned region.

Note that as a processing method of thinning the rear surface 1*l* of the tab 1*b*, a coining method may be adopted. Also, in the QFN 9 shown in FIGS. 15 and 16, since a tab raising process is not performed, the chip supporting face 1*c*, which is a surface for mounting the chip on the tab 1*b*, is disposed to have the same height as the sealing-portion forming surface 1*g* of each lead 1*a*.

Figure 17:
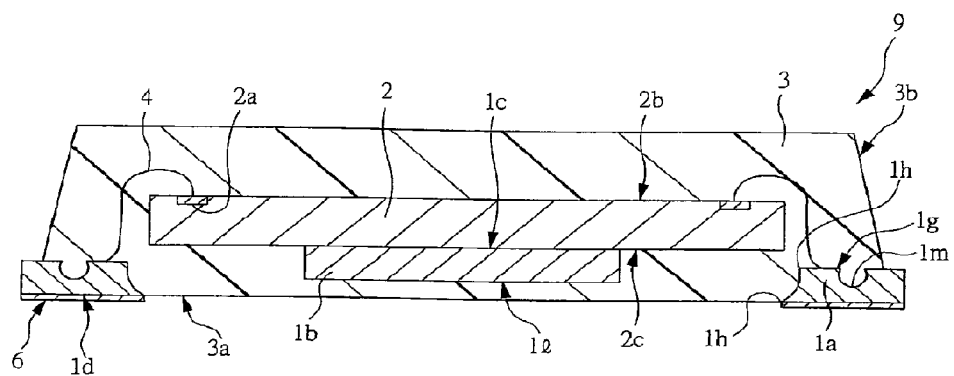
FIG. 17 is a sectional view showing a structure of a semiconductor device (QFN) that is a modified example of a second embodiment of the present invention.

Next, the QFN 9 that is a modified example shown in FIG. 17 has a tab embedding structure in which the tab raising process is performed and the chip supporting surface 1*c* of the tab 1*b* is disposed at a position more apart from a direction of a main-surface side of the chip than the sealing-portion forming surface 1*g* of each lead 1*a*. Also in this case, similarly to the QFN 9 shown in FIG. 15, since the sealing resin flows along the resin flow direction on a side of the rear surface 1*l* of the tab 1*b*, it is possible to introduce the sealing resin around and into a region between a side surface of the tab 1*b* and each lead 1*a* on the rear surface of the chip and to prevent voids from occurring in the above-mentioned region.

Thus, in the QFN 9 mounted on the semiconductor chip 2 having such large size that an end portion of the chip approaches the leads 1*a*, thinning the tab 1*b* and performing the tab raising process are effective for reducing the voids formed on the side surface of the tab 1*b* in the rear surface of the chip.

Next, the shape of leads in a QFN 9 according to a second embodiment will be described.

Figure 18:
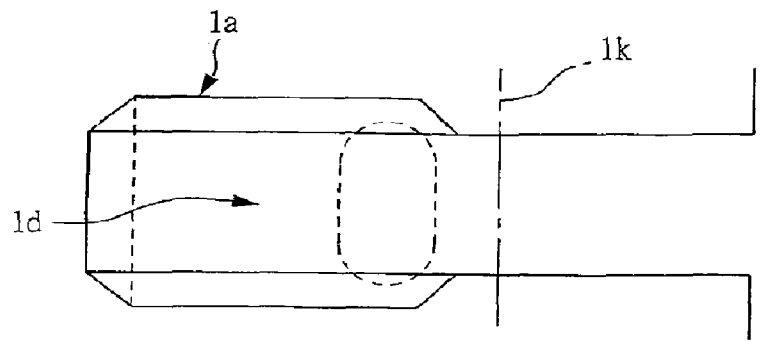
FIG. 18 is an enlarged partial bottom view showing a lead structure of a lead frame used for assembly of the QFN shown in FIG. 15.
Figure 19:
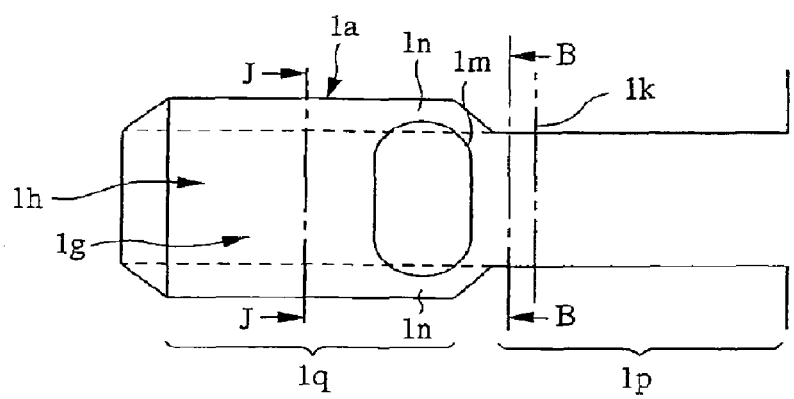
FIG. 19 is an enlarged partial plan view of the lead shown in FIG. 18.
Figure 20:
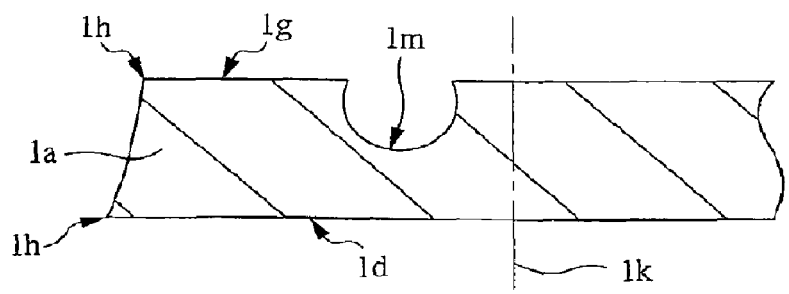
FIG. 20 is an enlarged partial sectional view of the lead shown in FIG. 18.

Each lead 1*a* shown in FIGS. 18 to 20 has the same shape as that of each lead 1*a* of the QFN 5 according to the first embodiment, wherein there is formed the concave portion 1*m*, which is one dent, outside the bonding point 1*f* corresponding to a wire joining point on the sealing-portion forming surface 1*g*. This concave portion 1*m* is a stress reducing means for reducing a stress applied to the wire joining point of each lead 1*a* at a time of cutting out the leads after the resin molding so that the above stress is concentrated on the concave portion 1*m* located outside the wire joining point to avoid applying the stress to the wire joining point located inside the concave portion 1*m*. Accordingly, wire peeling and/or wire cutting can be prevented from occurring.

Note that a single concave portion 1*m* is preferably formed in the sealing-portion forming surface 1*g* of each lead 1*a*. That is because a periphery of the bonding point if in the sealing-portion forming surface 1*g* must be ensured as a bonding region and, if it is intended to form the plurality of concave portions 1*m* except the bonding region, it becomes difficult to form the respective concave portions 1*m* sufficiently deeply. The concave portion 1*m* is such that as their depth shallows, a bonding force between the sealing resin and the concave portion 1*m* weakens and also an operation of stress relaxation decreases.

Also, if it is intended to form the concave portion 1*m* deeply, the width of the concave portion 1*m* must be ensured to some extent in the process and it is very difficult to ensure a region for two concave portions among regions other than the bonding region on the sealing-portion forming surface 1*g*.

Figure 36:
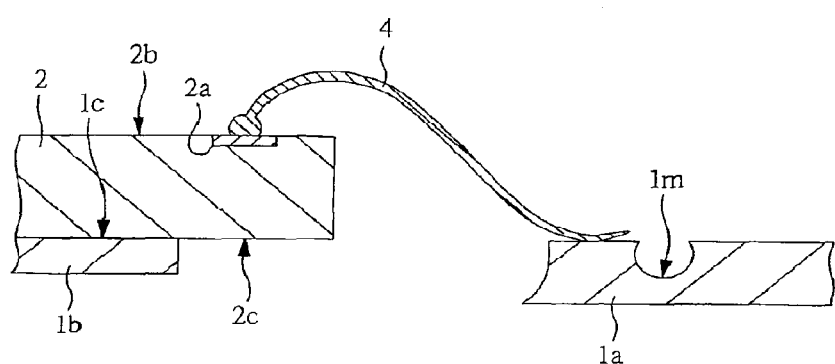
FIG. 36 is an enlarged partial sectional view showing one example of a structure at a time of wire bonding in the procedure shown in FIG. 35.

Further, in the wire bonding for the QFN 9, as shown in FIG. 36, a first bonding is carried out on a semiconductor chip side and a second bonding is carried out on a lead side. At that time, similarly to the first bonding, the second bonding requires an area wider than an area for the first bonding because the wire 4 is crushed and cut out to be connected to each lead 1*a* unlike a method of pressing and connecting a ball of gold wire (wire 4).

Therefore, in order to obtain a sufficient effect of stress relaxation, it is preferable to form a single concave portion 1*m* in a single lead 1*a*.

Next, in each lead 1*a* of the QFN 9, the concave portion 1*m* having a smaller width than that of the sealing-portion forming surface 1*g* is formed in the sealing-portion forming surface 1*g* with respect to a direction perpendicular to the extension direction of each lead 1*a*. That is, the concave portion 1*m* does not reach both side surfaces of each lead 1*a* and terminates within the sealing-portion forming surface 1*g*. As shown in FIG. 19, end heavy-walled portions 1*n* are formed on both ends in the width direction of the lead 1*a* of the concave portion 1*m*.

Since the end heavy-walled portions 1*n* are formed on both ends in the width direction of the lead of the concave portion 1*m*, it is possible to prevent deformation of each lead 1*a* at the time of the resin molding by ensuring the strength of each lead 1*a*.

Figure 38:
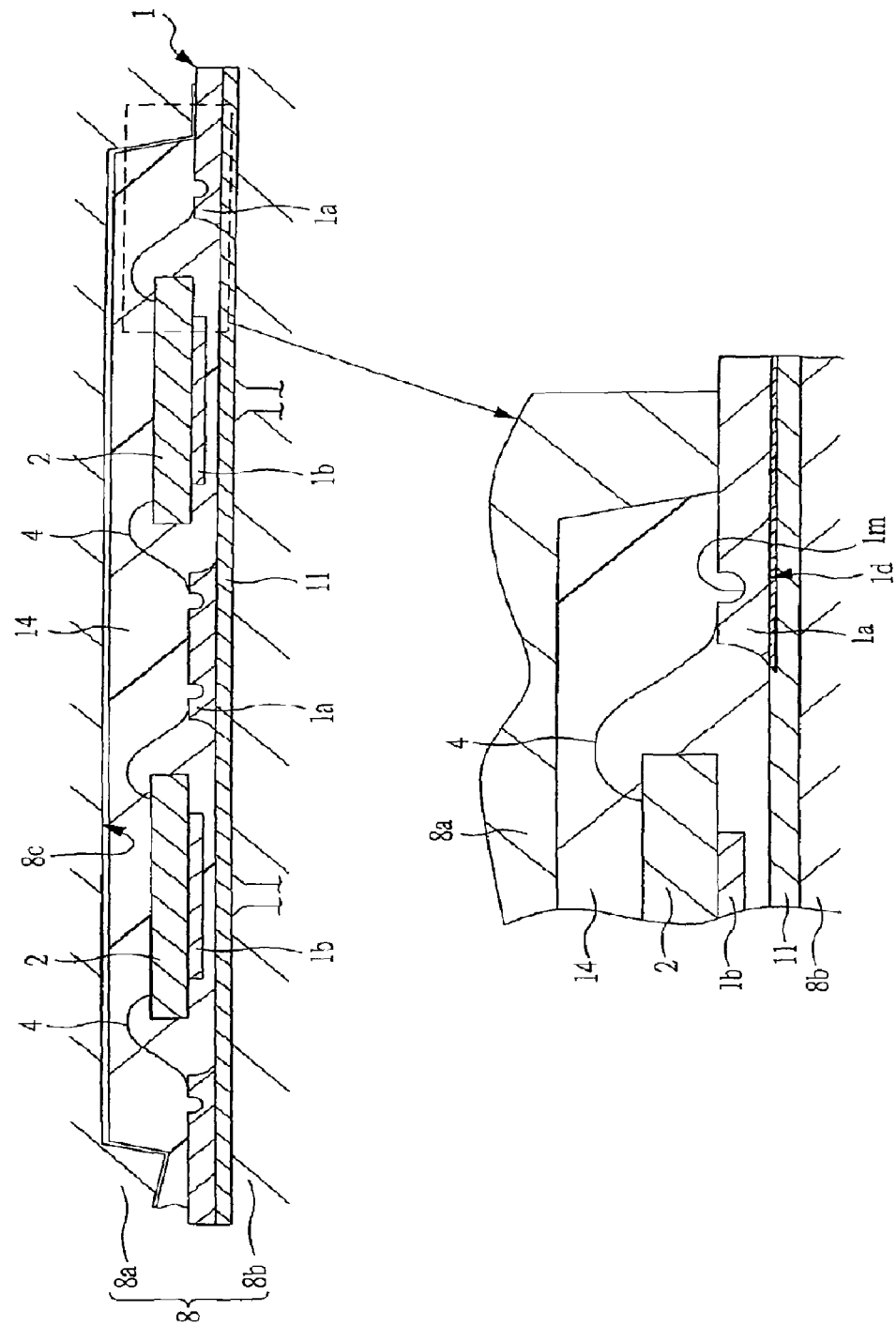
FIG. 38 is a partial sectional view and an enlarged partial sectional view which show one example of a structure at a time of resin molding in a procedure for the assemble shown in FIG. 37.

That is, when the resin molding using a film 1*l* as shown in FIG. 38 is adopted in a resin molding process for assembling the QFN 9, the film 1*l* is under each lead and each lead 1*a* is inserted into the film 1*l* by a clamp of a molding die 8 in order that the sealing resin is not made to intrude into the mounted surface 1*d* of each lead 1*a*. Then, under this state, the resin molding is carried out.

At this time, if the strength of each lead 1*a* is weak, there arises the drawback that the lead 1*a* is deformed by a reaction force exerted at a time of clamping the molding die 8. However, similarly to the lead shape shown in FIG. 19, since the end heavy-walled portions 1*n* are formed on both ends toward the lead-width direction of the concave portion 1*m*, the strength of each lead 1*a* is ensured and deformation of each lead 1*a* can be prevented at the time of the resin molding.

Also, as shown in FIG. 19, the lead 1a of the QFN 9 has a wire bonding portion 1q disposed on a chip side and a base portion 1p sandwiched between the inside and the outside of the side surface 3b of the sealing portion 3, wherein the sealing-portion forming surface 1g in the wire bonding portion 1q is formed larger in width than the sealing-portion forming surface 1g in the base portion 1p.

That is, in the lead 1a, the width of the sealing-portion forming surface 1g is different in the base portion 1p near the outside thereof and the wire bonding portion 1q inside the base portion, and the sealing-portion forming surface 1g of the wire bonding portion 1q located inside has larger width. Namely, a wide portion of the sealing-portion forming surface 1g extends outward from the end of the chip side of each lead 1a and terminates prior to the side surface 3b of the sealing portion 3, thereby becoming the base portion 1p extending from there so that the width of the sealing-portion forming surface 1g becomes narrow.

Consequently, the pulling strength of the lead 1a in the extending direction can be intensified and thereby can prevent the lead 1a from dropping out of the sealing portion 3.

Figure 21:
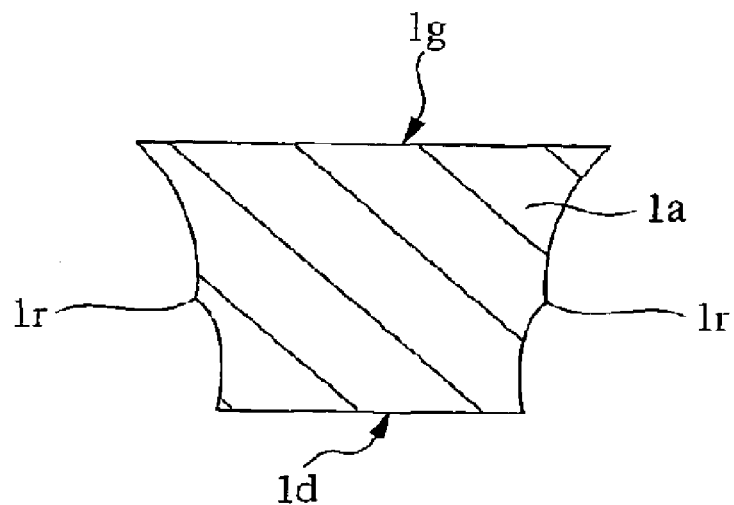
FIG. 21 is a sectional view taken along line 5-3 of the lead shown in FIG. 19.

Also, in the wire bonding portion 1q, the sealing-portion forming surface 1g is formed wider than the mounted surface 1d disposed on an opposite side thereof, and the sectional shape of the lead 1a in the width direction in the wire bonding portion 1q is an inverted trapezoidal shape in which its top side is longer than its bottom side, as shown in FIG. 21.

Consequently, the pulling strength of the lead 1a in the package-width direction can be intensified.

Also, since the lead 1a of the QFN 9 of a second embodiment adopts an etching process in processing its lead pattern, wherein at a time of the etching process, an etchant is applied from both sides of each of front and rear surfaces, so that the lead 1a is scraped from both the front and rear side surfaces.

Figure 22:
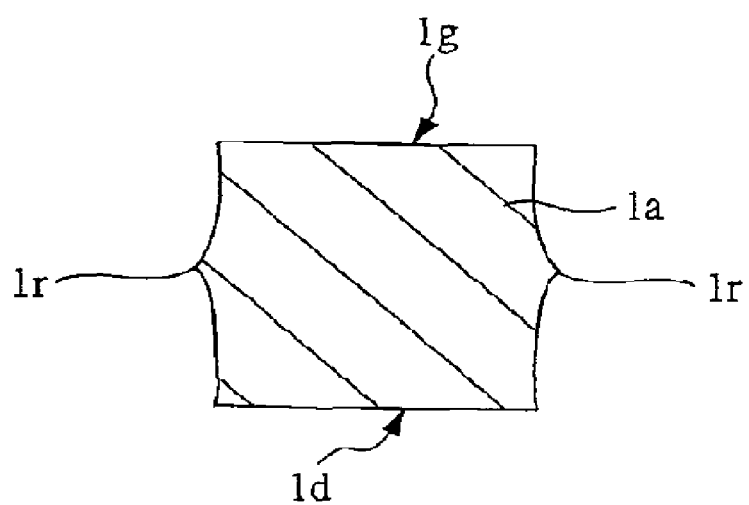
FIG. 22 is a sectional view taken along line B-B of the lead shown in FIG. 19.

Thus, curved coupling portions 1r are formed in the vicinity of a center and in a thickness direction of each lead 1a, in the sectional shape of each lead shown in FIGS. 21 and 22, and the strength and the pulling strength of the lead 1a can be improved by these curved coupling portions 1r.

Note that the lead-pattern process is not limited to the etching process, and may adopt a press process.

Next, the lead shapes of various kinds of modified examples shown in FIGS. 23 to 34, which are a second embodiment, will be described.

Figure 23:
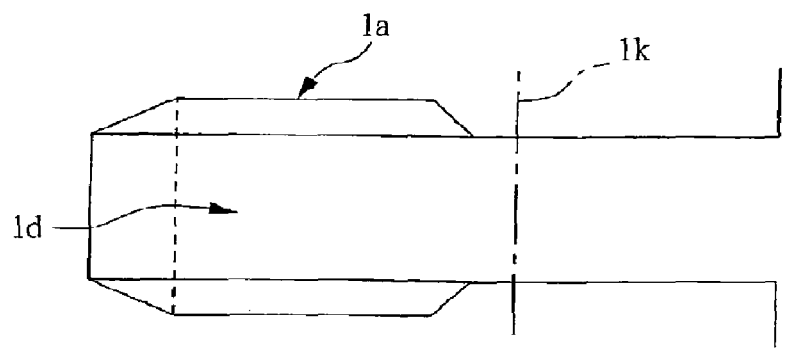
FIG. 23, FIG. 26, FIG. 29, and FIG. 32 are enlarged partial bottom views showing a lead structure of a modified example of a second embodiment of the present invention.
Figure 24:
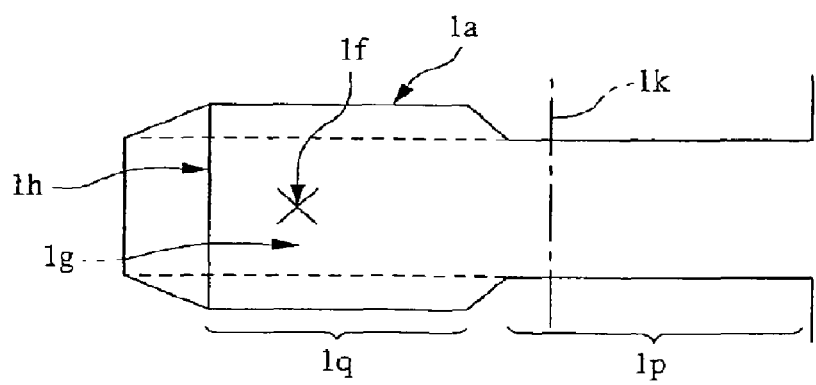
FIG. 24, FIG. 27, FIG. 30 and FIG. 33 are enlarged partial plan views of respective leads.
Figure 25:
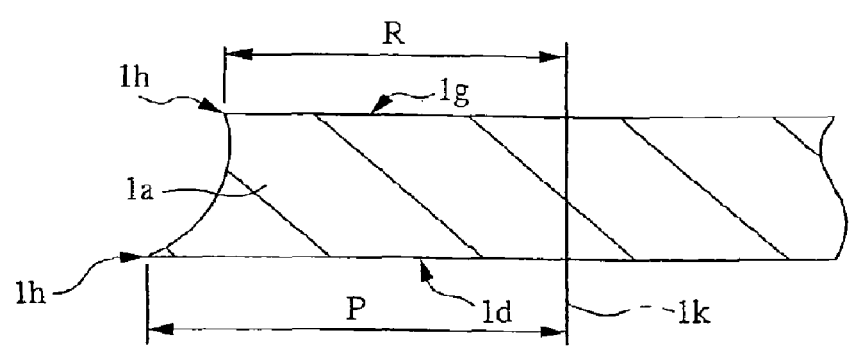
FIG. 25, FIG. 28, FIG. 31 and FIG. 34 are enlarged sectional views of respective leads.

The leads 1a shown in FIGS. 23 to 25 are equivalent to the leads 1a shown in FIGS. 18 to 20 in terms of their external shapes. As shown in FIG. 25, the respective lengths from mold lines 1k to chip-side ends in the sealing-portion forming surface 1g and the mounted surface 1d in the extending direction of the lead 1a are such that "the length (R)"<"the length (P)" is formed. Further, the concave portion 1m as shown in FIG. 19 is not formed in the sealing-portion forming surface 1g of the wire bonding portion 1q, and the sealing-portion forming surface 1g is constituted only by a flat surface. This lead shape is effective in cutting by a dicing using a blade 12 shown in FIG. 37, not in cutting by a punch, in a lead cutting process after the resin molding.

That is, in the cutting by the dicing, since the stress applied to each lead 1a is smaller at a time of the lead cutting than at a time of the cutting by the punch, the damages to the wire bonding portion are also small and therefore it is unnecessary to provide the concave portion 1m that is a stress relaxing means.

As a result, the wide bonding region can be ensured in the sealing-portion forming surface 1g in the wire bonding portion 1q of each lead 1a, so that the second bonding can easily be performed.

Figure 37:
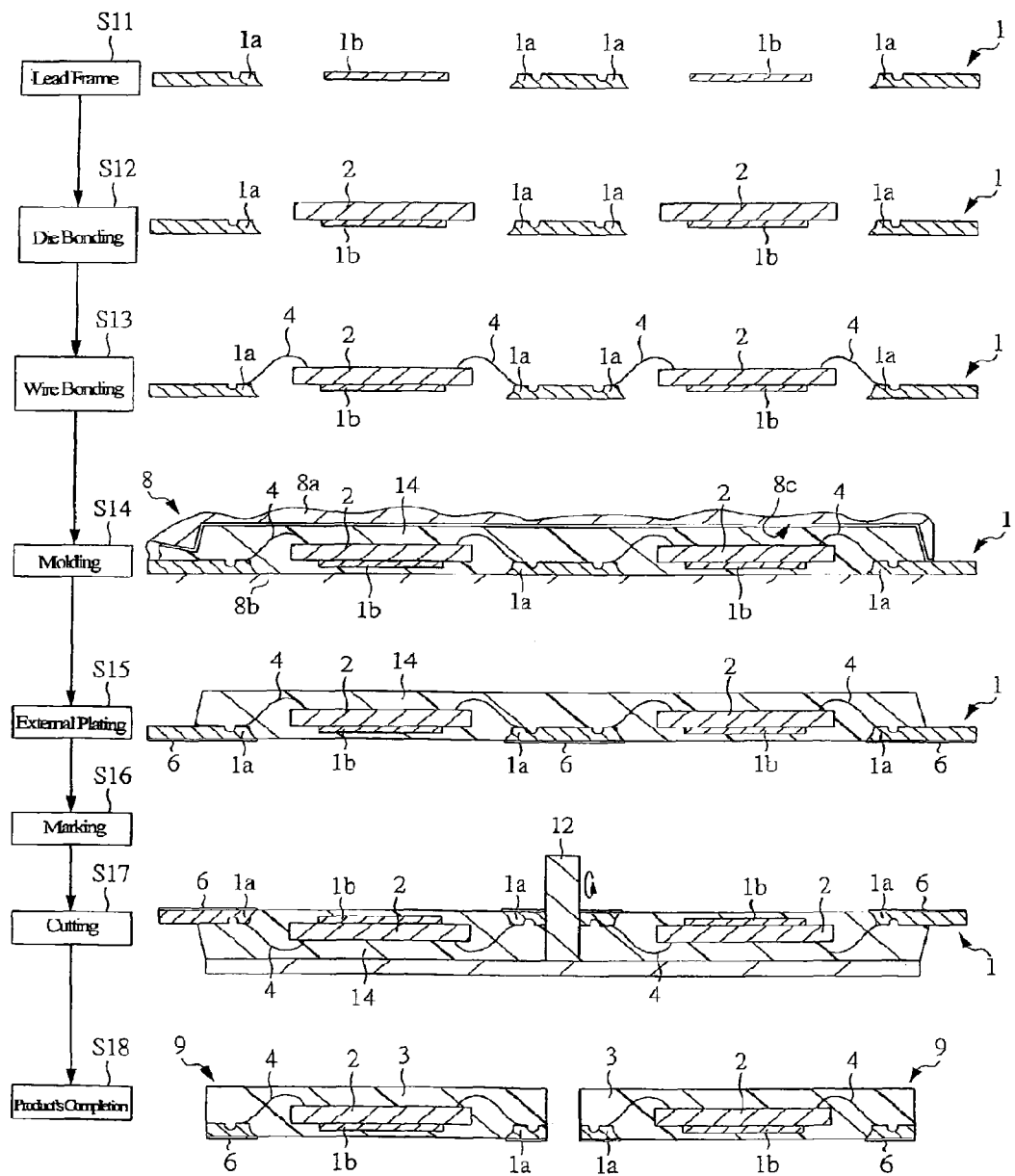
FIG. 37 is a manufacturing process flow diagram showing a procedure for assembly of a modified example (batch molding type) of a second embodiment of the present invention.

Note that the case of the cutting by the dicing means the case where the resin molding is executed in batch, that is, the resin molding is carried out with a plurality of device regions as shown in FIG. 37 are covered with a single cavity 8c in the molding die 8.

Figure 26:
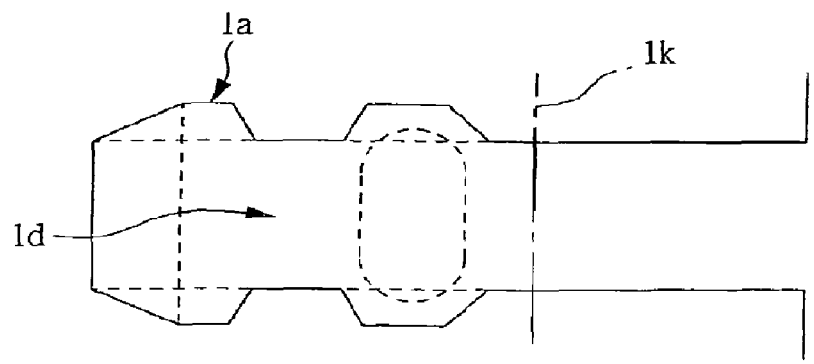
Figure 27:
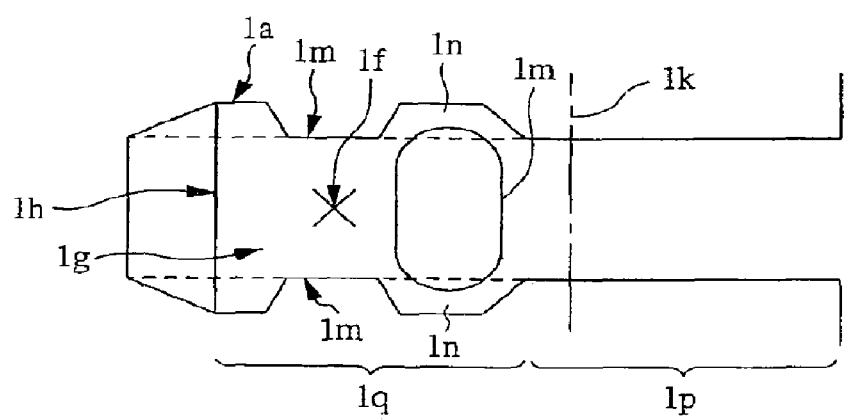
Figure 28:
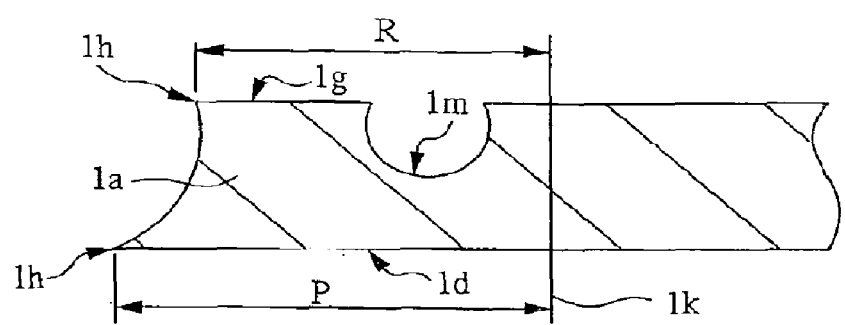

Next, in the lead shapes of modified examples shown in FIGS. 26 to 28, the concave portions 1m are formed as stress relaxing means in both side surfaces of the wire bonding portion 1q with respect to each lead 1a.

That is, in the wire bonding portion 1q of the lead 1a, totally three concave portions 1m, each of which comprises a concave portion 1m in the sealing-portion forming surface 1g and concave portions 1m in both side surfaces, are formed, so that a sectional area of an outside region can be sufficiently made smaller than that of the bonding point 1f in the wire bonding portion 1q of each lead 1a. Therefore, the stress applied to the bonding region at the time of cutting each lead by the punch can be reduced sufficiently, and it is possible to prevent drawbacks such as wire peeling and wire cutting from occurring at the time of cutting the lead by the punch.

Note that the stress relaxing means in each lead 1a may have such a shape that the sectional area of each lead 1a is made smaller at an outside point than the bonding point 1f, and may be, for example, the concave portion 1m, a slit, a notch, or the like.

Figure 29:
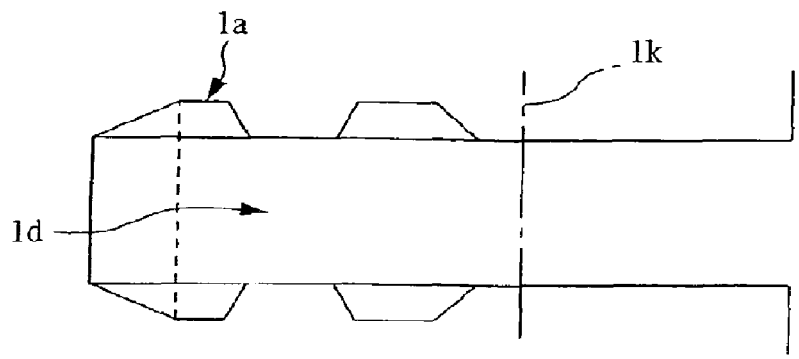
Figure 30:
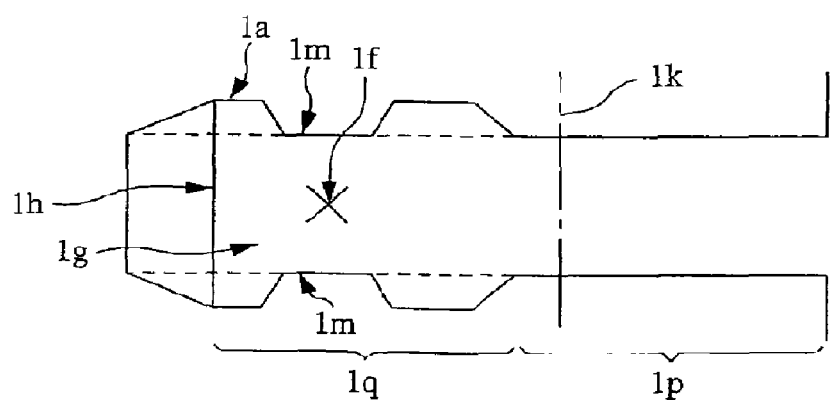
Figure 31:
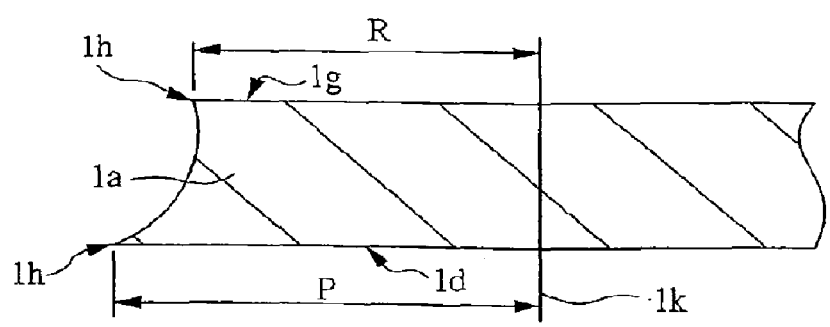

Next, in the lead shapes of modified examples shown in FIGS. 29 to 31, the sealing-portion forming surface 1g is set to a flat surface, and the concave portions 1m that are the stress relaxing means are formed on both side surfaces of the wire bonding portion 1q with respect to each lead 1a.

Thus, since the concave portion 1m is not formed and only the flat surface exists in the sealing-portion forming surface 1g, the wide bonding region can be ensured and the stress occurring at a time of cutting the leads can be reduced by the concave portions 1m formed in both side surfaces.

Figure 32:
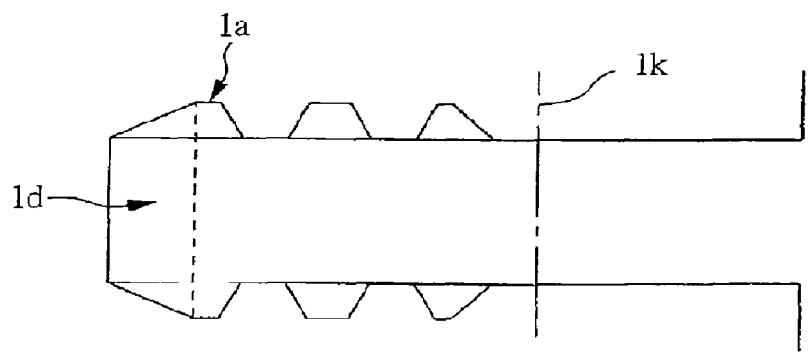
Figure 33:
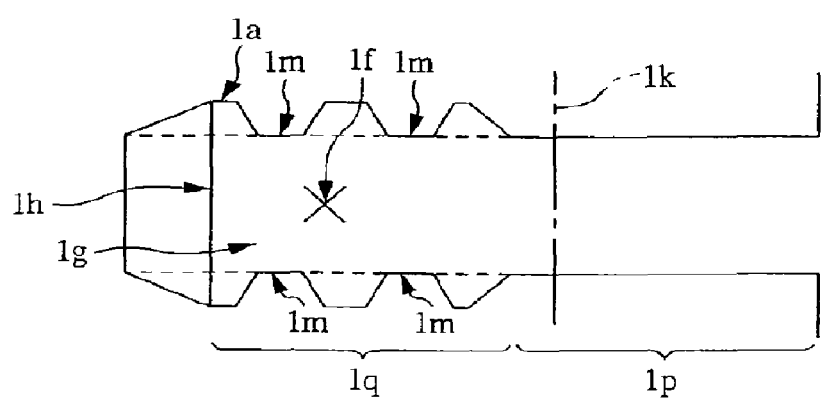
Figure 34:
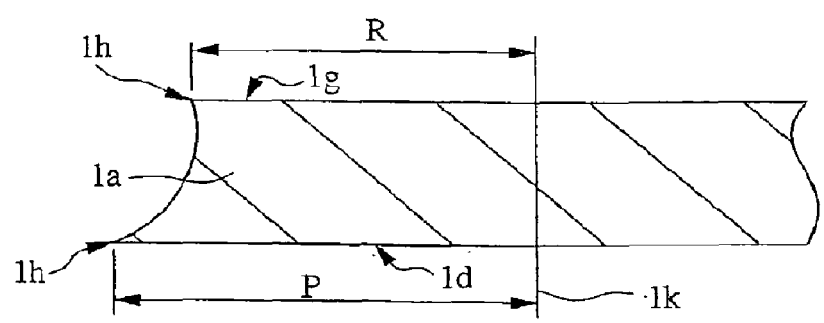

Also, in the lead shapes of the modified examples shown in FIGS. 32 to 34, the sealing-portion forming surface 1g is set to a flat surface and the two concave portions 1m each serving as the stress relaxing means are formed on both side surfaces of the wire bonding portion 1a with respect to each lead 1a.

For this reason, it is possible to ensure the wide bonding region and concurrently reduce further the stress at a time of cutting the leads.

Next, a manufacturing method for semiconductor devices according to the second embodiment will be described.

Figure 35:
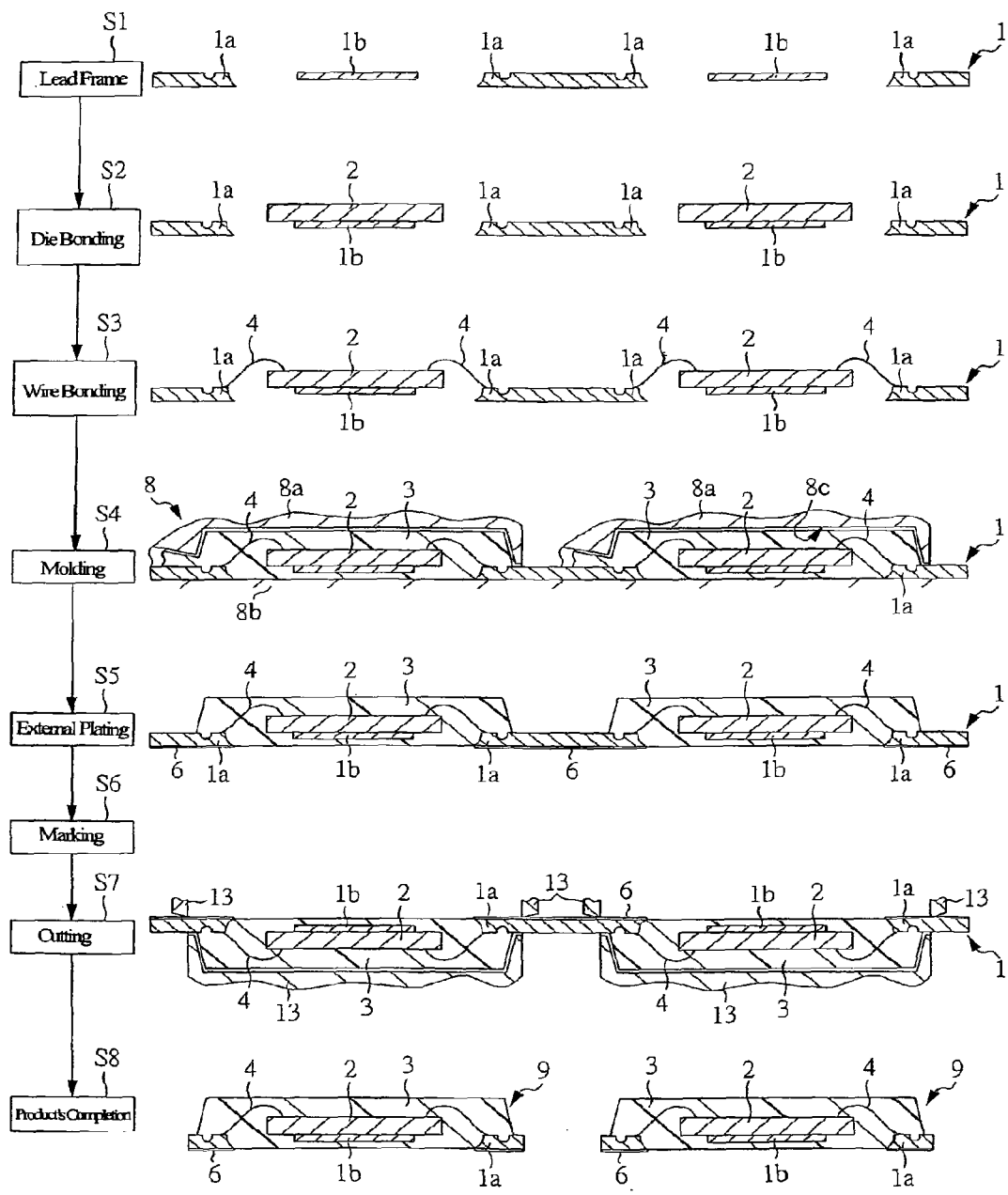
FIG. 35 is a manufacturing process flow diagram showing one example of an assembly procedure for the GFN (single-piece molding type) shown in FIG. 15.

Firstly, assembly of the QFN 9 of a single molding type will be described with reference to FIG. 35.

As shown in step S1, there is prepared the lead frame 1, which comprises: the tab 1b capable of supporting the semiconductor chip 2; the tab hanging lead 1e for supporting the tab 1b; and the plurality of leads 1a disposed around the tab 1b and each having the mounted surface 1d and the sealing-portion forming surface 1g, wherein it is formed so that the length between the inner ends 1h of the sealing-portion forming surfaces 1g of the leads 1a disposed to oppose to each other is set larger than the length between the inner ends 1h of the mounted surfaces 1d and the concave portion 1m serving as a stress relaxing means is provided to each lead 1a.

That is, as shown in FIG. 2, there is prepared the lead frame 1 in which each lead 1a is such that "the length (Q) of each sealing-portion forming surface 1g"<"the length (P) of the mounted surface 1d" is formed.

Note that the lead frame 1 is a stripe-shaped multiple type which can manufacture the plurality of QFNs 9 from one sheet of lead frame 1. Further, the QFNs 9 can be manufactured in matrix arrangement on one sheet of lead frame 1 and thereby the plurality of package regions, each of which corresponds to one QFN 9, are formed in matrix arrangement on one sheet of lead frame 1.

Thereafter, the die bonding shown in FIG. S2 is carried out.

In this step, the semiconductor chip 2 in which a semiconductor integrated circuit is formed on a main surface 2b is prepared, and the semiconductor chip 2 is disposed on the tab 1b, which is located within a region surrounded by the inner ends 1h of the respective sealing-portion forming surfaces 1g of the plurality of leads 1a.

Thereafter, the die bonding (also called pellet bonding or chip mounting) for joining the rear surface 2c of this semiconductor chip 2 and the chip supporting surface 1c of the tab 1b is carried out.

That is, the semiconductor chip 2 is mounted on the chip supporting surface 1c of the lead frame 1.

At this time, the semiconductor chip 2 is fixed to the tab 1b of the lead frame 1 through a die bonding material (e.g., silver paste, bonding film (adhesive tape) or the like) so that its main surface 2b is faced upward.

Subsequently, wire bonding shown in step S3 is carried out.

In this step, the wire bonding is carried out so that the pad 2a of the semiconductor chip 2 is connected, by the conductive wire 4 such as a gold wire, to a vicinity of the bonding point 1f of the sealing-portion forming surface 1g in a region located inside the concave portion 1m of the lead 1a, which corresponds to the pad and is shown in FIG. 19.

At that time, firstly, the first bonding for connecting the pad 2a of the semiconductor chip 2 and the wire 4 is carried out, and then the second bonding for connecting the wire 4 and a vicinity of the bonding point if located inside the concave portion 1m in the sealing-portion forming surface 1g of the wire bonding portion 1q of the lead 1a is carried out.

As shown in FIG. 36, the above-mentioned second bonding requires a bonding region wider in area than the first bonding region since the wire 4 is crushed and cut out and connected to the lead 1a. However, in case of the lead 1a of the second embodiment, the second bonding region is easy to ensure and the second bonding can be executed easily because only one concave portion 1m is formed in the sealing-portion forming surface 1g of the lead 1a.

Thereafter, transfer molding is carried out in step S4. In this step, the resin molding is carried out using the molding die 8 of a single-piece molding type in which the cavity 8c of the molding die 8 corresponds to the QFN 9 one to one.

At this time, the resin molding is carried out so that the mounted surfaces 1d of the plurality of leads 1a are exposed to and arranged on the peripheral portion of the rear surface 3a of the sealing portion 3. Consequently, by resin-sealing the semiconductor chip 2 and the plurality of wires 4, the sealing portion 3 is formed on a side of the sealing-portion forming surface 1g of the lead frame 1 (single-surface molding is carried out).

Consequently, the plurality of sealing portions 3 are formed on the lead frame 1 in matrix arrangement.

Thereafter, external plating is carried out in step S5 to form a soldered plating layer 6 on the mounted surface 1d of the lead 1a.

Thereafter, marking in step S6 is carried out to attach a desired mark to the sealing portion 3 of the QFN 9.

Then, cutting in step S7 is carried out to individuate the QFNs 9.

At that time, a portion located outside the concave portion 1m, which is a stress relaxing means of each lead 1a, is clipped by a cutting die 13 and each lead 1a projecting from the sealing portion 3 is cut out by a punch to separate each lead from the lead frame 1 (separation to individual pieces).

When the lead is cut out, the stress is concentrated to a place where the concave portion 1m is formed, i.e., to a portion having the smallest sectional area of the wire bonding portion 1q of the lead 1a. At that time, since the concave portion 1m is located outside the wire bonding position of the second bonding, the stress at the time of cutting is concentrated to the concave portion 1m.

Therefore it is possible to prevent drawbacks such as wire peeling and wire cutting from occurring at a time of cutting out the leads.

Thereby, the cutting of the lead is finished, and products of the QFNs 9 shown in step S8 are completed.

Next, assembly of a batch molding type QFN 9 will be described with reference to FIG. 37.

Note that, in batch sealing in which the resin molding is carried out by covering the plurality of device regions with one cavity 8c of the molding die 8, the lead cutting is executed by the dicing. In the case of the lead cutting by the dicing, since the stress applied to the lead 1a at the time of cutting is smaller than that at the time of cutting by the punch, it is also possible to adopt the sealing-portion forming surface 1g which has only a flat surface as shown in FIG. 24. However, the case of adopting the lead 1a in which one concave portion 1m is formed in the sealing-portion forming surface 1g shown in FIG. 19 will be described.

Firstly, as shown in step S11, there is prepared the lead frame 1 comprising: the tab 1b capable of supporting the semiconductor chip 2; the tab hanging lead 1e for supporting the tab 1b; the plurality of leads 1a disposed around the tab 1b and each having the mounted surface 1d and the sealing-portion forming surface 1g are provided, wherein the length between the inner ends 1h of the sealing-portion forming surfaces 1g of the leads 1a disposed to oppose to each other is set larger than the length between the inner ends 1h of the mounted surfaces 1d and further the concave portion 1m, which is as a stress relaxing means and has smaller width than that of the sealing-portion forming surface 1g, is provided on the sealing-portion forming surface 1g of each lead 1g with respect to a direction perpendicular to the extending direction of the lead 1a.

That is, as shown in FIG. 2, each lead 1a is such that "the length (Q) of each sealing-portion forming surface 1g"<"the length (P) of the mounted surface 1d" is formed, and further the lead frame 1 on which the end heavy-walled portion in shown in FIG. 19 is formed is prepared on both ends located in the width direction of the lead of each concave portion 1m.

Note that the lead frame 1 is a strip-shaped multiple type which can manufacture the plurality of QFNs 9 from one sheet of lead frame 1. Further, the QFNs 9 can be manufactured in matrix arrangement on the one sheet of lead frame 1, and thus the plurality of package regions, each of which corresponds to one QFN 9, are formed in matrix arrangement on the one sheet of lead frame 1.

Thereafter, the die bonding shown in step S12 is carried out.

In this step, the semiconductor chip 2, in which a semiconductor integrated circuit is formed on its main surface 2b, is prepared, and the semiconductor chip 2 is disposed on the tab 1b located within a region surrounded by the inner end 1h of each sealing-portion forming surface 1g of the plurality of leads 1a shown in FIG. 2.

Thereafter, the die bonding (called pellet bonding or chip mounting) of joining the rear surface 2c of this semiconductor chip 2 and the chip supporting surface 1c of the tab 1b is carried out.

That is, the semiconductor chip 2 is mounted on the chip supporting surface 1c of the tab 1b of the lead frame 1.

At that time, the semiconductor 2 is fixed on the tab 1b of the lead frame 1 through a die bonding material (e.g., silver paste etc.) so that its main surface 2b is faced upward.

Subsequently, the wire bonding shown in step S13 is carried out.

In this step, the pad 2a of the semiconductor chip 2 is connected, by the conductive wire 4 such as a gold wire, to a vicinity of the bonding point 1f on the sealing-portion forming surface 1g located within an range outside the concave portion 1m of the lead 1a, which corresponds to the pad and is shown in FIG. 19, and thereby the wire bonding is carried out.

At this time, firstly, the first bonding for connecting the pad 2a of the semiconductor chip 2 and the wire 4 is carried out, and then the second bonding for connecting the wire 4 to the vicinity of the bonding point if located inside the concave portion 1m in the sealing-portion forming surface 1g of the wire bonding portion 1q of the lead 1a is carried out. In the case of the lead 1a of the second embodiment, since only one concave portion is formed in the sealing-portion forming surface 1g of the lead 1a, the second-bonding region is easy to ensure and the second bonding can be carried out easily.

Thereafter, molding of step S14 is executed. In this step, there is performed the batch molding in which the plurality of device regions are covered with one cavity 8c of the molding die 8 in a batch manner to perform the resin molding.

At that time, the resin molding is carried out in each device region so that the mounted surfaces 1d of the plurality of leads 1a are exposed to and arranged on the peripheral portion of the rear surface 3a of the sealing portion 3. At a time of the batch molding, firstly, as shown in FIG. 38, the film 1l is disposed on a die surface of a lower die 8b of the molding die 8, and the dies are clamped in a state in which the plurality of device regions are covered with one cavity 8c of an upper die 8a of the molding die 8. As shown in a partially enlarged diagram of FIG. 38 by the die clamping, the resin molding is carried out by making the mounted surface 1d of the lead 1a intruding into the film 1l. Consequently, a batch sealing portion 14 is formed so that the mounted faces 1d of the plurality of leads 1a are exposed to and arranged on the peripheral portion of the rear surface 3a.

Note that since the end heavy-walled portions shown in FIG. 19 are formed on both ends located in the lead-width direction of the concave portion 1m in the lead 1a, the strength of the lead 1a can be ensured and it is possible to prevent occasion of the drawback that the lead la is deformed due to a reaction force occurring at a time of clamping the molding die 8.

After the molding, a soldered layer 6 is formed on the mounted surface 1d of the lead 1a by performing the external plating in step S15.

Thereafter, a desired mark is attached to a position corresponding to the sealing portion 3 of each QFN 9 by the marking in step S16.

Then, the QFN 9 is divided to individual pieces by cutting in step S17.

At this time, in this step, each lead 1a and the batch sealing portion 14 are cut out by the dicing to be separated from the lead frame 1. That is, each lead 1a and the batch sealing portion 14 are cut out using a blade 12, whereby separation to individual pieces is carried out.

Note that in the cutting by the dicing using the blade 12, since the stress applied to the lead 1a is smaller at a time of the lead cutting than at a time of the cutting by a punch, damages to the wire bonding portion are also small and drawbacks such as wire peeling and wire cutting can be prevented from occurring.

Then, the cutting of the lead is finished, and products of the QFNs 9 shown in step S18 are completed.

Third Embodiment

In a third embodiment, a structure for enhancing a heat-radiation property in a semiconductor device having a QFN structure will be described. That is, the QFN 5 described in the first embodiment is formed so that the length (M) between the inner ends 1h of the sealing-portion forming surfaces 1g of the leads 1a disposed to oppose to each other is longer than the length (L) between the inner ends 1h of the mounted surfaces 1d, that is, "the length (M)">"the length (L)" is formed. Consequently, it is possible to expand the chip loading region surrounded by the inner end 1h of the sealing-portion forming surface 1g of each lead 1a and to increase the mountable chip size without changing the package size. However, in such a semiconductor device, as shown in FIGS. 39 and 41, the QFN 15 of the third embodiment is such that there is mounted the semiconductor chip 2 having such large size that the chip end approaches each lead 1a.

In this case, as the semiconductor chip 2 becomes large in size, the heat-radiation property of the chip is required to be improved. Therefore, there is required a structure for exposing the tab 1b from the rear surface 3a of the sealing portion 3 and for increasing the size of the tab 1b up to substantially the same size as the semiconductor chip 2.

Figure 39:
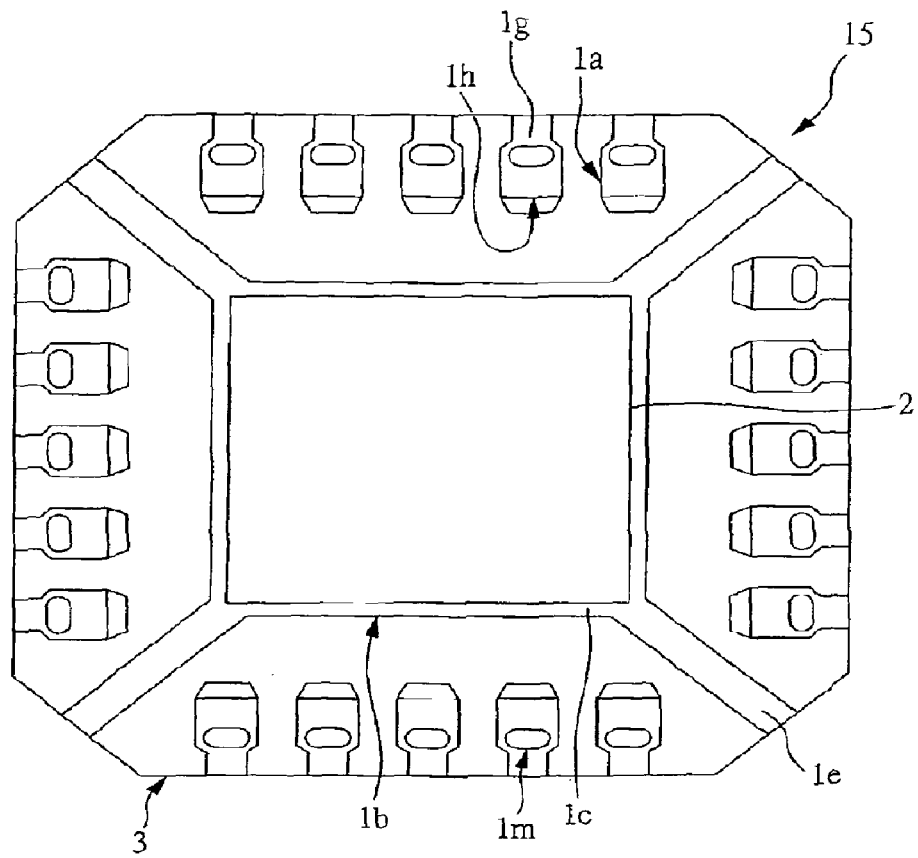
FIG. 39 is a plan view showing, through a sealing portion, one example of a structure of a QFN according to a third embodiment of the present invention.
Figure 40:
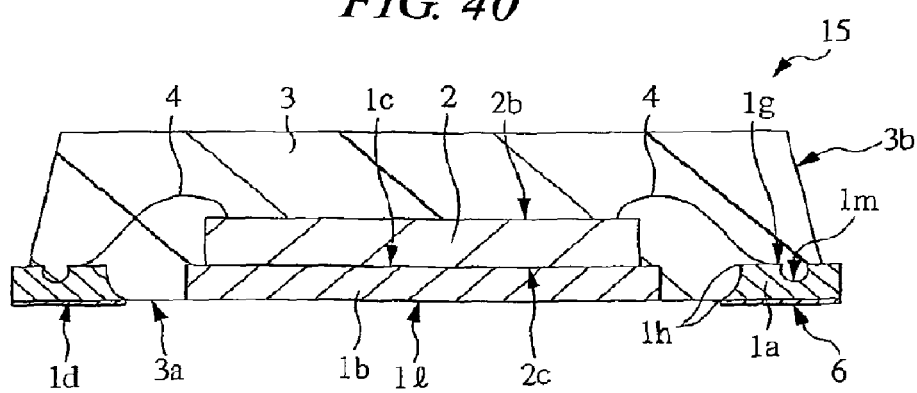
FIG. 40 is a sectional view showing the structure of the QFN shown in FIG. 39.

In the QFN 15 shown in FIGS. 39 and 40, by adopting the tab 1b slightly larger in size than the semiconductor chip 2, this tab 1b is exposed to the rear surface 3a of the sealing portion 3 and consequently the heat-radiation property of the QFN 15 can be improved.

Figure 41:
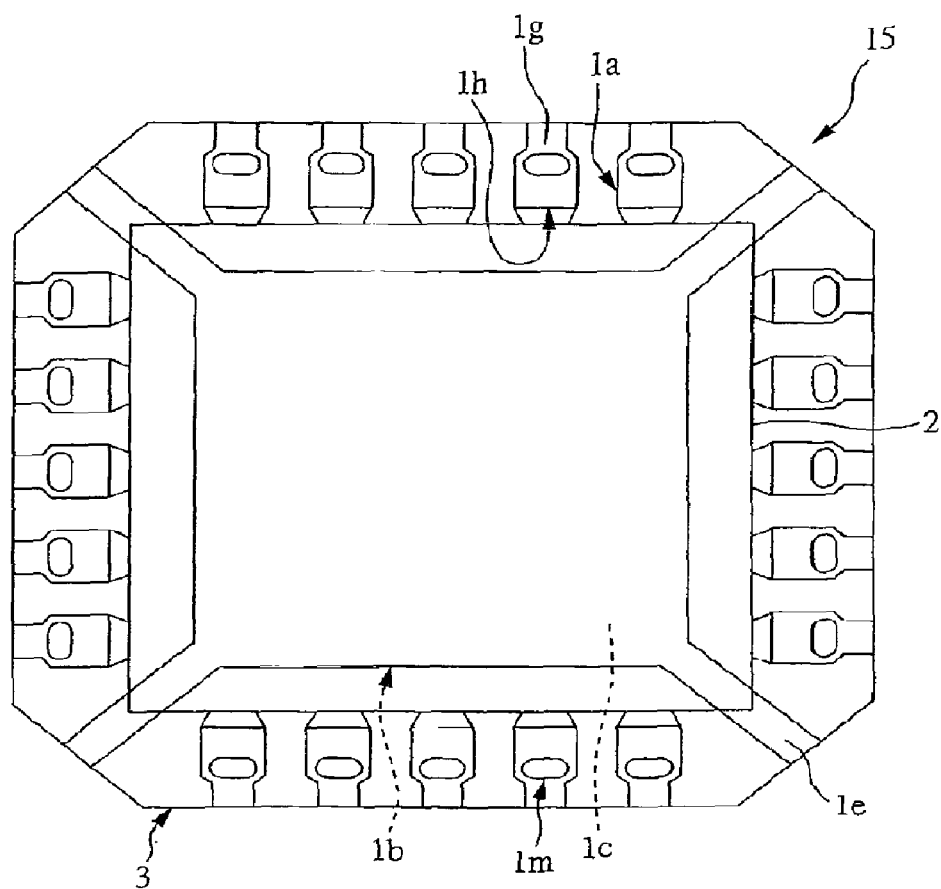
FIG. 41 is a plan view showing, through a sealing portion, a structure of a QFN that is a modified example of a third embodiment of the present invention.
Figure 42:
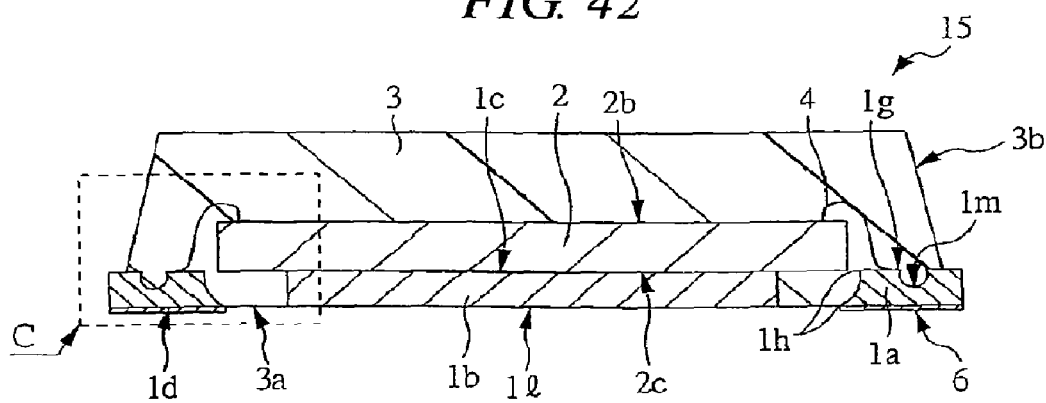
FIG. 42 is a sectional view showing the structure of the QFN shown in FIG. 41.

Also, in the QFN 15 shown in FIGS. 41 and 42, the tab 1b slightly smaller in size than the semiconductor chip 2 is adopted, and this tab 1b is exposed to the rear surface 3a of the sealing portion 3, so that the heat-radiation property of the QFN 15 can be improved.

Figure 43:
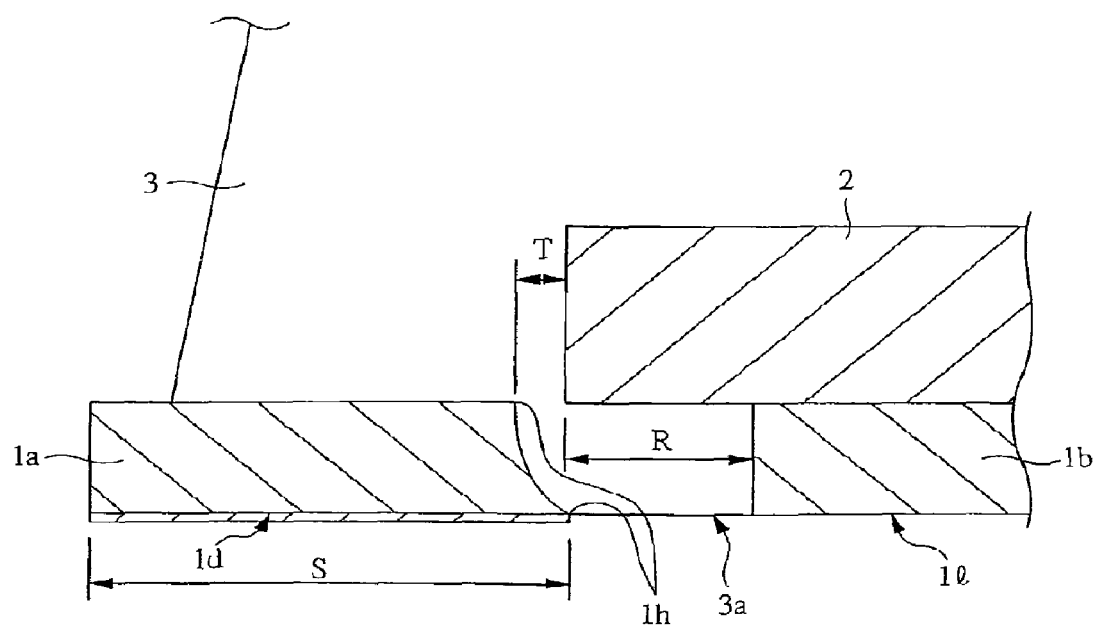
FIG. 43 is an enlarged partial sectional view showing a structure of the C portion shown in FIG. 42.

Note that, as shown in a partially enlarged diagram of FIG. 43, in the case of the QFN 15 having a structure in which the semiconductor chip 2 is overhung outside the tab 1b. the length (overhung length: R) projecting from the end portion of the tab 1b of the semiconductor chip 2 is preferably is equal to or less than the length (S) of the mounted surface 1d of the lead 1a with respect to a lead extending direction. That is, it is desired to form "(R)≦(S)".

For this reason, the length projecting from the end portion of the tab 1b of the semiconductor chip 2 can be suppressed and consequently there can be provided a gap (T) between the end portion of the chip and the inner end 1h of the lead 1a. Therefore, at the time of the resin molding, the sealing resin can be made to intrude also around and into the side surface of the tab 1b on a side of the rear surface 2c of the semiconductor chip 2, whereby voids can be prevented from being formed on the side surface of the tab 1b.

Fourth Embodiment

A fourth embodiment is a technique for further downsizing the size of a semiconductor device having a QFN structure, and is mainly a semiconductor device in which stabilization of a fixed potential such as a GND potential is achieved. In this case, a QFN 16 having a semiconductor chip 2 in which a circuit operated by high frequency is incorporated will be described as an example.

The QFN 5 shown in FIG. 2 and described in the first embodiment is formed so that the length (M) between the inner ends 1h of the sealing-portion forming surfaces 1g of the leads 1a disposed to oppose to each other becomes longer than the length (L) between the inner ends 1h of the mounted surfaces 1d and consequently the chip mounting region surrounded by the inner end 1h of the sealing-portion forming surface 1g of each lead 1a can be expanded and enlargement of the size of the mountable chip without changing the package size is achieved. However, in such a semiconductor device, the QFN 16 of the fourth embodiment is intended not to increase a common terminal such as a GND terminal allocated to the lead 1a but to stabilize a fixed potential such as a GND potential by using a portion of the tab hanging lead 1e as an external terminal for the common terminal.

Thus, by using the portion of the tab hanging lead 1e as an external terminal for GND, a GND lead conventionally allocated to the lead 1a can be made an empty lead and hence the size of the semiconductor device can be reduced by decreasing the number of leads.

Figure 44:
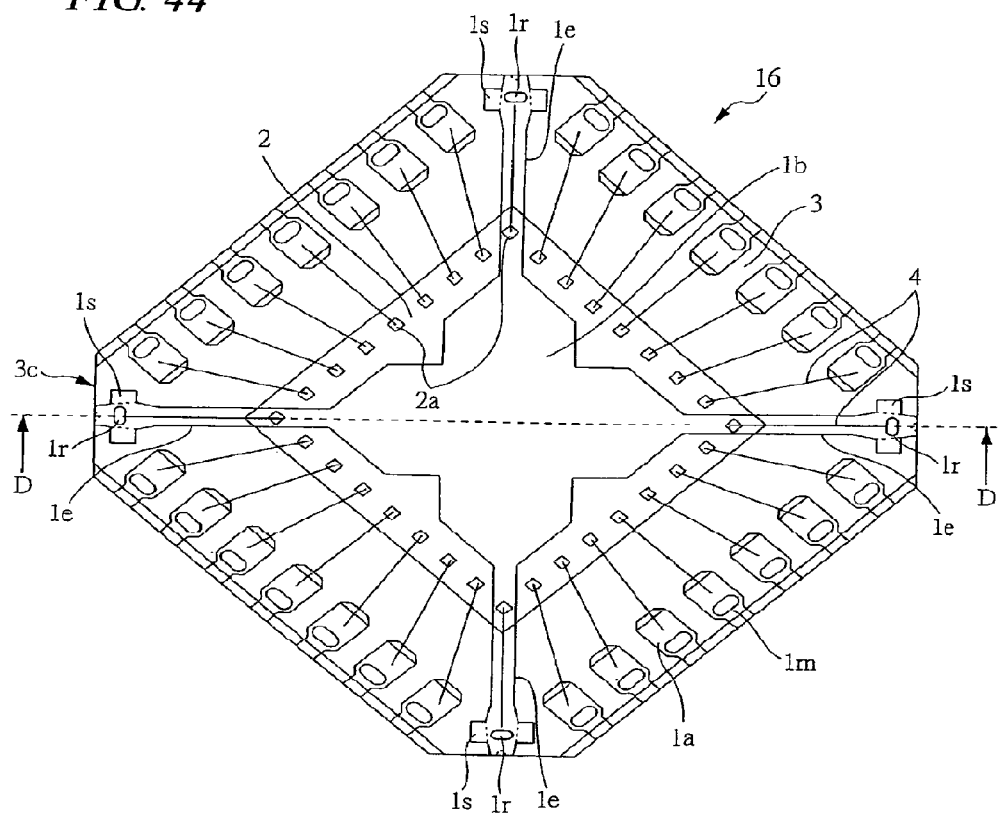
FIG. 44 is a plan view showing, through a sealing portion, one example of a structure of a QFN according to a fourth embodiment of the present invention.
Figure 45:
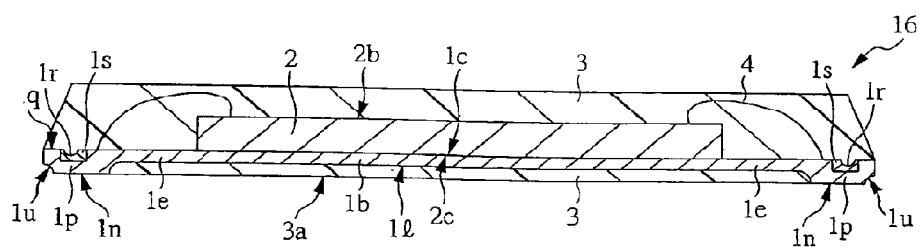
FIG. 45 is a sectional view showing a structure taken along the line D-D of FIG. 44.

The QFN 16 shown in FIGS. 44 and 45 is formed so that the length (M) between the inner ends 1h of the sealing-portion forming surfaces 1g of leads 1a disposed so as to oppose to each other is larger than the length (L) between the inner ends 1h of the mounted surfaces 1d similarly to the QFN 5 shown in FIG. 2. Consequently, the chip mountable region surrounded by the inner end 1h of the sealing-portion forming surface 1g of each lead 1a can be expanded, and concurrently the conductive wire 4, whose one end is connected to the pad 2a of the semiconductor chip 2, is such that the other end is connected to a region opposing to the above-mentioned mounted surface in of an upper surface 1q that is an opposite surface to the mounted surface 1n of the tab hanging lead (hanging lead) 1e.

That is, the pad 2a for GND of the semiconductor chip 2 is connected to the tab hanging lead 1e through the wire 4, and since the four tab hanging leads 1e are respectively linked to the tab 1b, the four tab hanging leads 1e are used as a common external terminal for GND.

At this time, a connecting position of the wire 4 to the tab hanging lead 1e is an upper surface 1q opposing to the mounted surface 1n of an exposed portion 1p of the tab hanging lead 1e.

That is, as shown in FIG. 45, the wire 4 is connected to a portion which is not eccentric in a thickness direction of the tab hanging lead 1e (e.g., a portion not subjected to a process such as change in thickness or bending). In the QFN 16 shown in FIG. 45, the tab 1b and the tab hanging lead 1e are partially half-etched and the wire 4 is connected to the exposed portion 1p in which the thickness of the tab hanging lead 1e is not changed.

Note that the wire bonding to the tab hanging lead 1e is preferably performed at as outside a position of the tab hanging lead 1e as possible in order to improve the stability thereof at the time of the wire bonding. This is for securely making a heat block used at the time of the wire bonding contact closely with the exposed portion 1p. Thereby, heat or ultrasonic wave generated at the time of the wire bonding is securely transmitted from the exposed portions 1p of the tab hanging lead 1e and so the wire bonding to the tab hanging lead 1e can be stabilized.

Further, since it is easily possible to make the semiconductor chip 2 large in size, the wire bonding to the tab hanging lead 1e is preferably carried out at as outside a position of the tab hanging lead 1e as possible.

Figure 46:
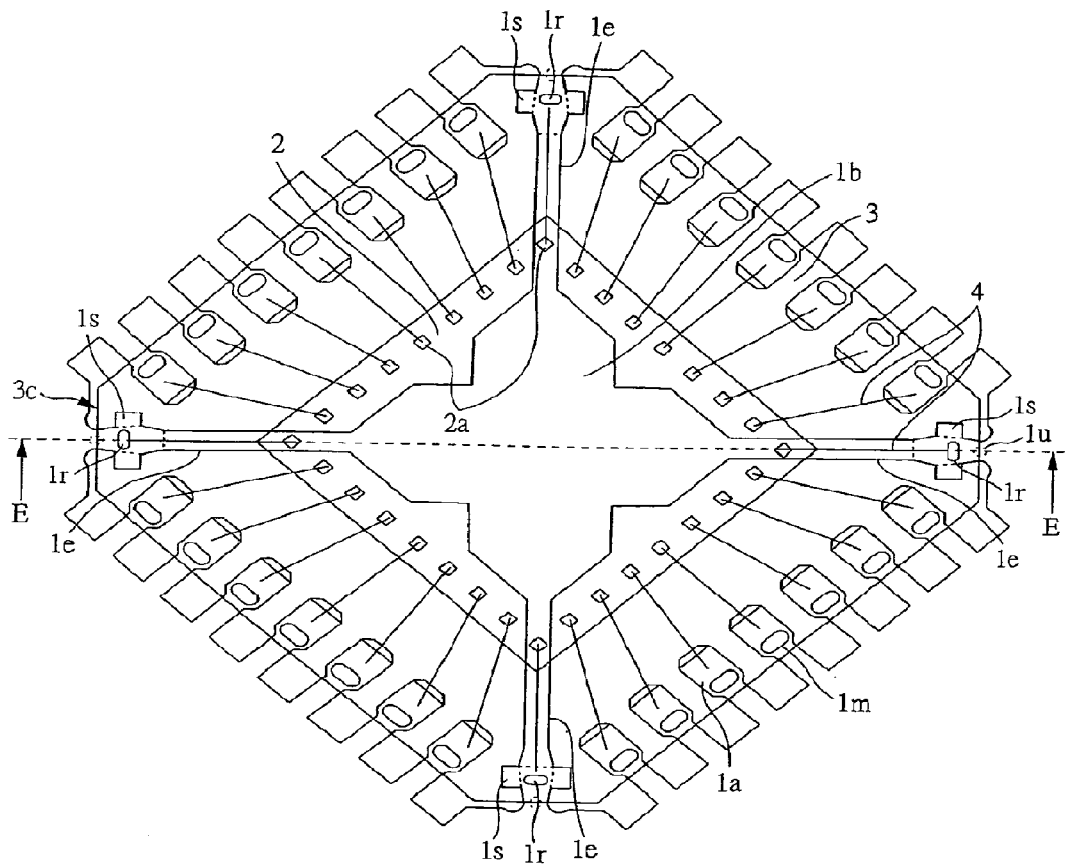
FIG. 46 is a partial plan view showing, through a sealing portion, one example of a structure obtained after resin molding in assembly of the QFN shown in FIG. 44.

Also, a concave portion 1r, which is a slit, is formed outside the connecting position of the wire 4 in the upper surface 1q of the exposed portion 1p of the tab hanging lead 1e of the QFN 16. In the case where the lead cutting is performed in the structure obtained after the resin molding and shown in FIGS. 46 and 47, the above-mentioned concave portion 1r relaxes the stress applied to the connecting position of the wire 4 on the tab hanging lead 1e at a time of the cutting by tearing of the tab hanging lead 1e.

Figure 47:
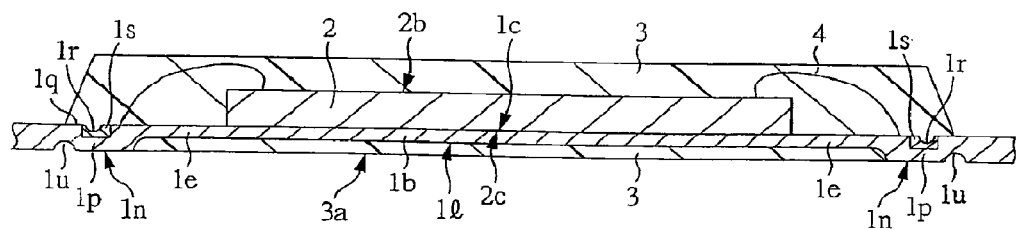
FIG. 47 is a partial sectional view showing a structure taken along the line E-E of FIG. 46.

That is, the cutting by tearing of the tab hanging lead 1e is carried out so as to apply a rotational stress to the notch portion 1u of the tab hanging lead 1e as shown in FIG. 47 and tear it. At this time, the stress in the lead-thickness direction at the time of the cutting is concentrated to the concave portion 1r so that the stress due to the cutting is not applied to the connecting position of the wire 4. Consequently, wire peeling can be prevented from occurring at the time of cutting the tab hanging lead 1e.

Further, when a leak path on the tab hanging lead 1e can be lengthened by the concave portion 1r, an amount of water invading along the tab hanging lead 1e can be reduced.

Also, projecting portions is are provided in both side surfaces located outside a position to which the wire 4 of the exposed portion 1p of the tab hanging lead 1e is connected. This projecting portion is relaxes the stress applied to the connecting position of the wire 4 on the tab hanging lead 1e at the time of the cutting by tearing of the tab hanging lead 1e similarly to the concave portion 1r, and further relaxes a stress exerted in a lead-horizontal direction at the time of cutting the tab hanging lead 1e. That is, when the tab hanging lead 1e is cut out, this projecting portion is receives the stress caused by the cutting in the lead-horizontal direction so that the stress by the cutting is not applied to the connecting position of the wire 4.

Further, the leak path on the tab hanging lead 1e can be lengthened even by this projecting portion 1s, and an amount of water invading along the tab hanging lead 1e can be reduced.

Figure 50:
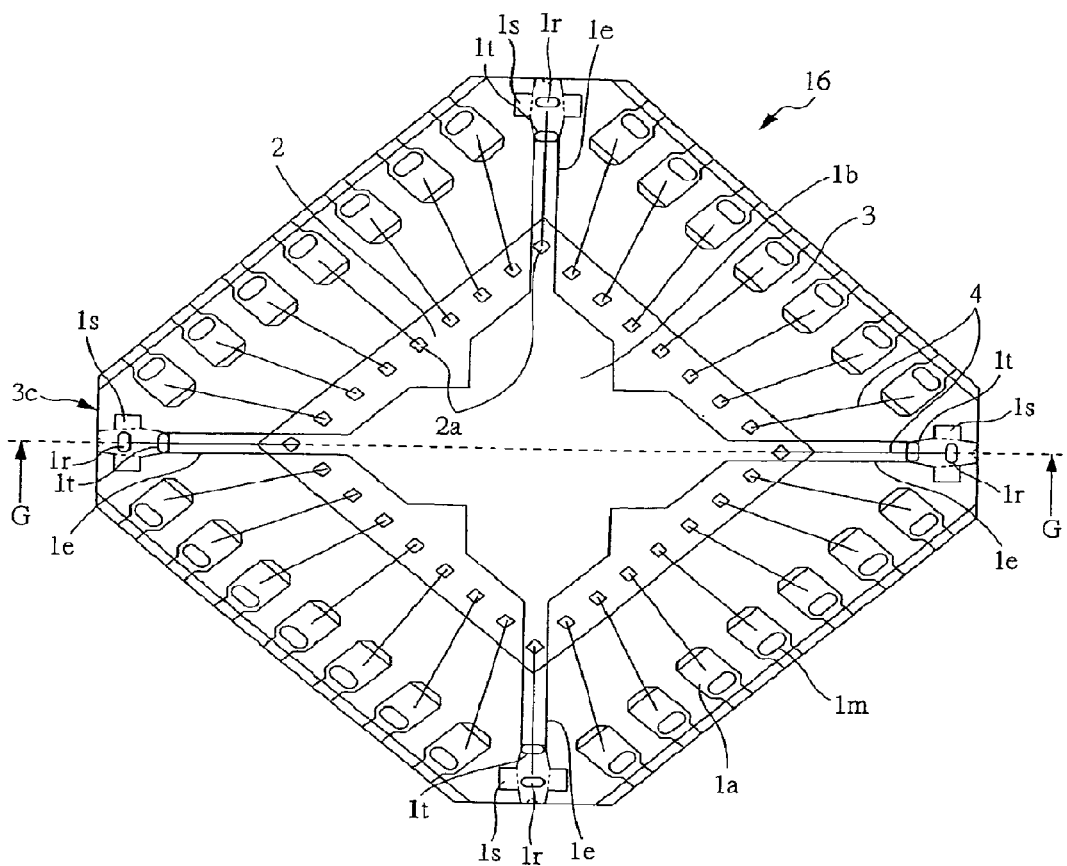
FIG. 50 is a plan view showing, through a sealing portion, a structure of a QFN that is a modified example of a fourth embodiment of the present invention.
Figure 51:
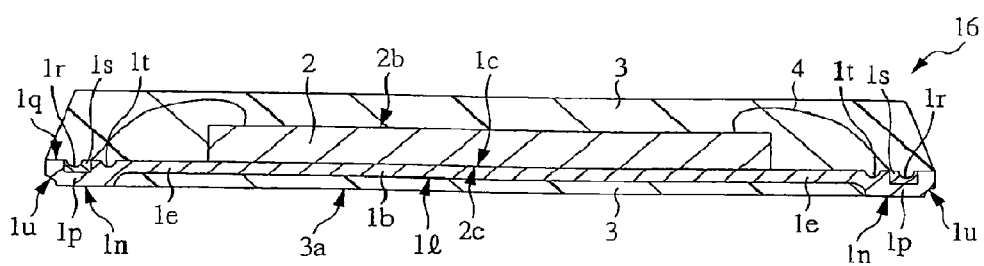
FIG. 51 is a sectional view showing a structure taken along the line G-G of FIG. 50.

Also, as shown in a QFN 16 of a modified example in FIGS. 50 and 51, another concave portion 1t may be further formed inside the connecting position of the wire 4 on the upper surface 1q of the exposed portion 1p of the tab hanging lead 1e. The concave portion it formed inside the connecting position of the wire 4 is intended to absorb a heat stress at the time of conducting a reliability test (temperature cycle test) in a state in which the QFN 16 is mounted on a mounting substrate 17 (see FIG. 53), and thereby can prevent the heat stress from being applied to the connecting position of the wire 4 at the time of the reliability test.

Note that in the QFN 16 of the fourth embodiment, so as not to decrease the number of leads 1a in using the tab hanging lead 1e as an external terminal for GND, each of chamfered portions 3c at four corners on the rear surface 3a of the sealing portion 3 is disposed in the mounted surface 1n of the exposed portion 1p of the tab hanging lead 1e.

That is, in the semiconductor device having the original QFN structure, since the tab hanging leads 1e are disposed on the corners of the sealing portion 3, the mounted surfaces 1n of the exposed portions 1p of the tab hanging leads 1e are disposed on the corners of the sealing portion 3 by using the above arrangement and each of the mounted surfaces in is used as an external terminal for GND. Therefore, it is unnecessary to decrease the number of leads 1a. In other words, by using the tab hanging lead 1e as an external terminal for GND, the lead for GND conventionally allocated to the lead 1a can be made an empty lead, and hence the semiconductor device can be downsized by reducing the number of leads.

Consequently, a mounting area of the QFN 16 can be reduced.

Figure 48:
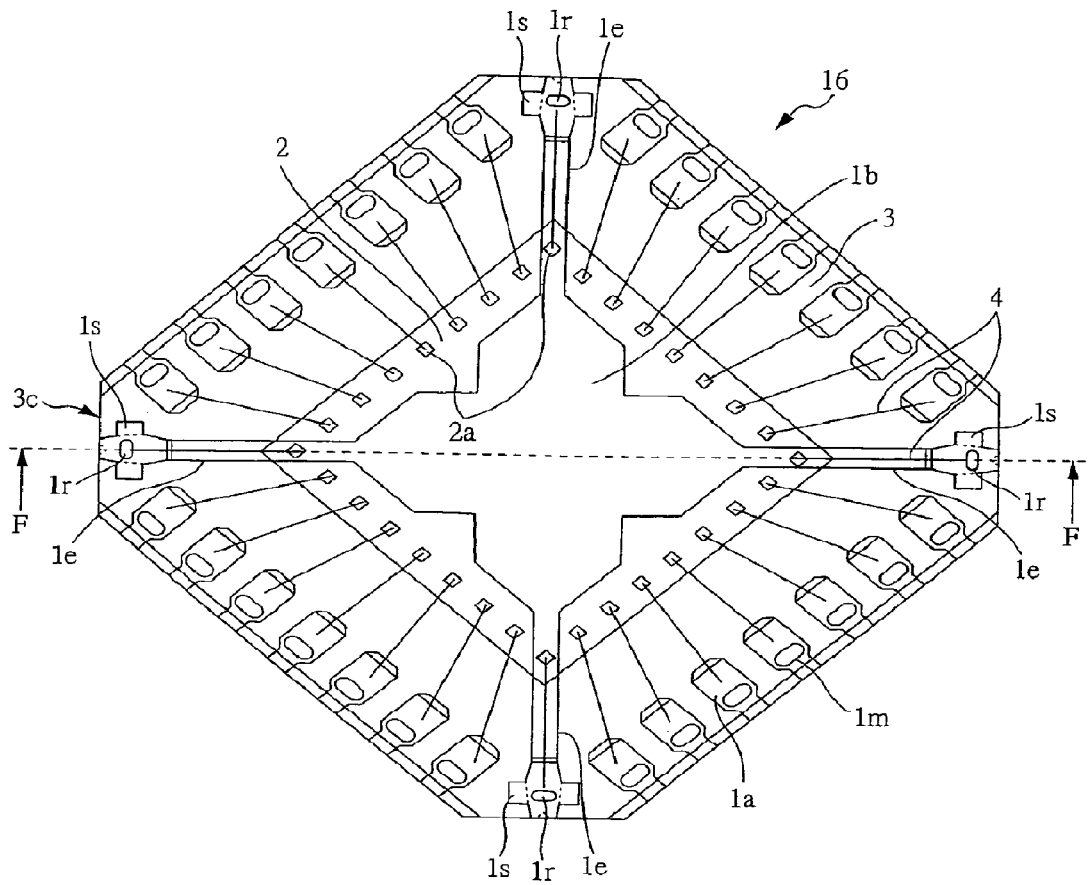
FIG. 48 is a plan view showing, through a sealing portion, a structure of a QFN that is a modified example of a fourth embodiment of the present invention.
Figure 49:
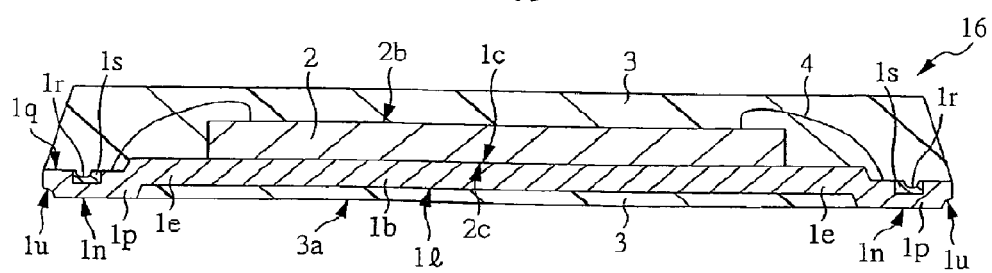
FIG. 49 is a sectional view showing a shape taken along the line F-F of FIG. 48.

Also, a QFN 16 of a modified example shown in FIGS. 48 and 49 has a structure in which a tab raising process is performed so that the position of the tab 1b is higher than that of the lead 1a, and consequently becomes a tab embedding structure in which the tab 1b is sealed by the sealing portion 3. Note that the QFN 16 shown in FIGS. 44 and 45 is such that the rear surface 1l of the tab 1b is formed thin by half etching and, also in this case, the QFN becomes a tab embedding structure in which the tab 1b is sealed by the sealing portion 3.

By adopting such a tab embedding structure, since the tab 1b is not exposed to the rear surface 3a of the sealing portion 3, the wire can be led around a region located below the tab 1b when the QFN is mounted, so that a degree of freedom of leading the wires around the mounting substrate 17 can be improved.

Next, an arrangement relation between the external terminal (lead 1a and tab hanging lead 1e) at the time of the QFN mounting and the terminal 17a of the mounting substrate 17 will be described.

Figure 52:
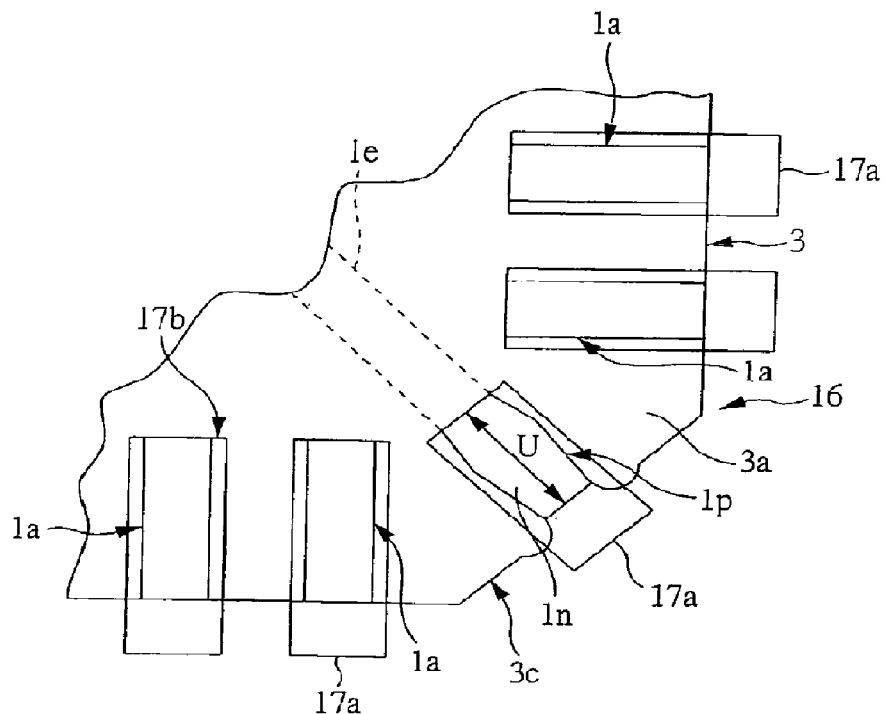
FIG. 52 is an enlarged partial plan view showing one example of a relation between a mounted surface of each lead and a terminal of a mounting substrate in a structure for mounting, on the substrate, a QFN according to a fourth embodiment of the present.

Firstly, as shown in FIG. 52, the length (U) of the mounted surface 1n in the lead extending direction in the exposed portion 1p of the tab hanging lead 1e is preferably larger than the thickness of the exposed portion 1p of the tab hanging lead 1e. As an example, when the thickness (thickness of lead frame) of the exposed portion 1p is 0.2 mm, U=0.55 mm. At this time, the thickness and length (U) of the exposed portion 1p are not limited to these values.

Thus, by increasing the length (U) of the exposed portion 1p of the tab hanging lead 1e, since a connecting area with the terminal 17a of the loading substrate 17 increases, the heat-radiation property of the QFN 16 can be improved.

In this case, in a region outside the mounted surface 1n of the exposed portion 1p of the tab hanging lead 1e, a shortest-distance portion between the leads 1a adjacent to each other is sealed by the sealing portion 3. That is, in view of a heat-radiation property, the mounted surface 1n of the exposed portion 1p is preferably extended inward. However, it is necessary to take care of solder leaks because the adjacent leads 1a are disposed on both sides of the tab hanging lead 1e, as shown in FIG. 52.

Therefore, since the shortest-distance portion between the adjacent leads 1a in the region located inside the mounted surface 1n of the tab hanging lead 1e is sealed by the sealing portion 3, the solder leaks can be prevented at the time of the mounting onto the mounting substrate 17.

Figure 53:
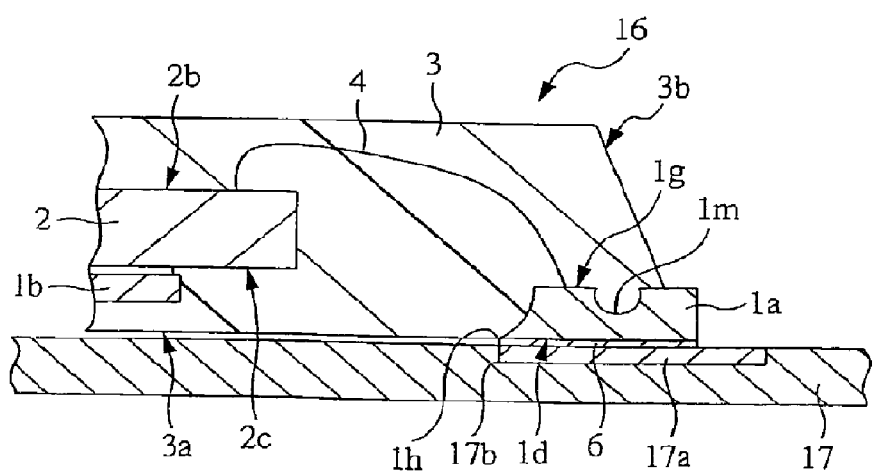
FIG. 53 is an enlarged partial sectional view showing a connecting state of a lead and a terminal on a substrate in the mounting structure shown in FIG. 52.

Further, as shown in FIG. 53, the terminal 17a of the mounting substrate 17 connected to the lead 1a adjacent to the tab hanging lead 1e is preferably disposed so that its inner end 17b coincides planarly with or is outside the inner end 1h of the mounted surface 1d of the lead 1a.

That is, in mounting the QFN 16 on the mounting substrate 17, the inner end 17b of the terminal 17a of the mounting substrate 17 is disposed so as to coincide planarly with or be outside the inner end 1h of the mounted surface 1d of the corresponding lead 1a. Therefore, the terminal 17a of the mounting substrate 17 can be prevented from approaching to such an extent that it contacts with the exposed portion 1p of the lead 1e, whereby the solder leaks occurring in the mounting substrate 17 at the time of the mounting can be prevented.

Next, an electric characteristic inspection of the QFN 16 of this embodiment will be described.

Figure 54:
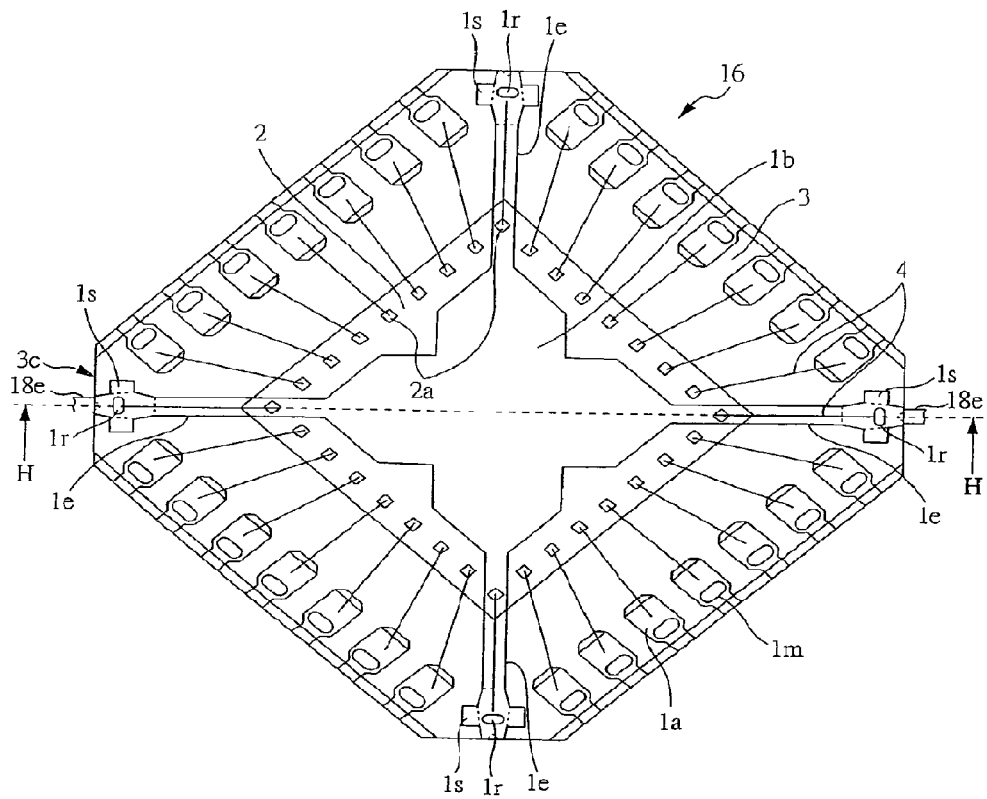
FIG. 54 is a plan view showing, through a sealing portion, one example of a state at a time of an electric characteristic inspection executed after assembly of a QFN according to a fourth embodiment of the present invention.
Figure 55:
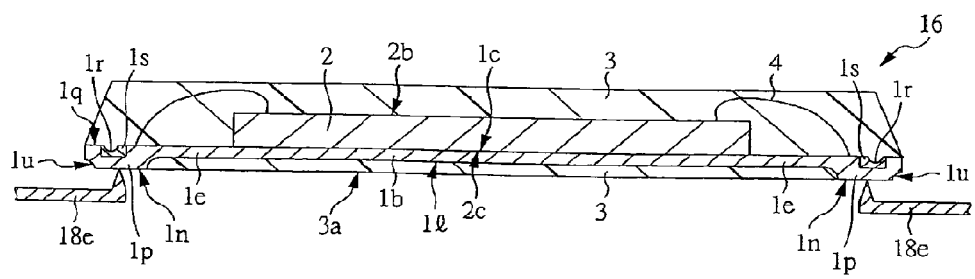
FIG. 55 is a sectional view showing a structure taken along the line H-H of FIG. 54.
Figure 56:
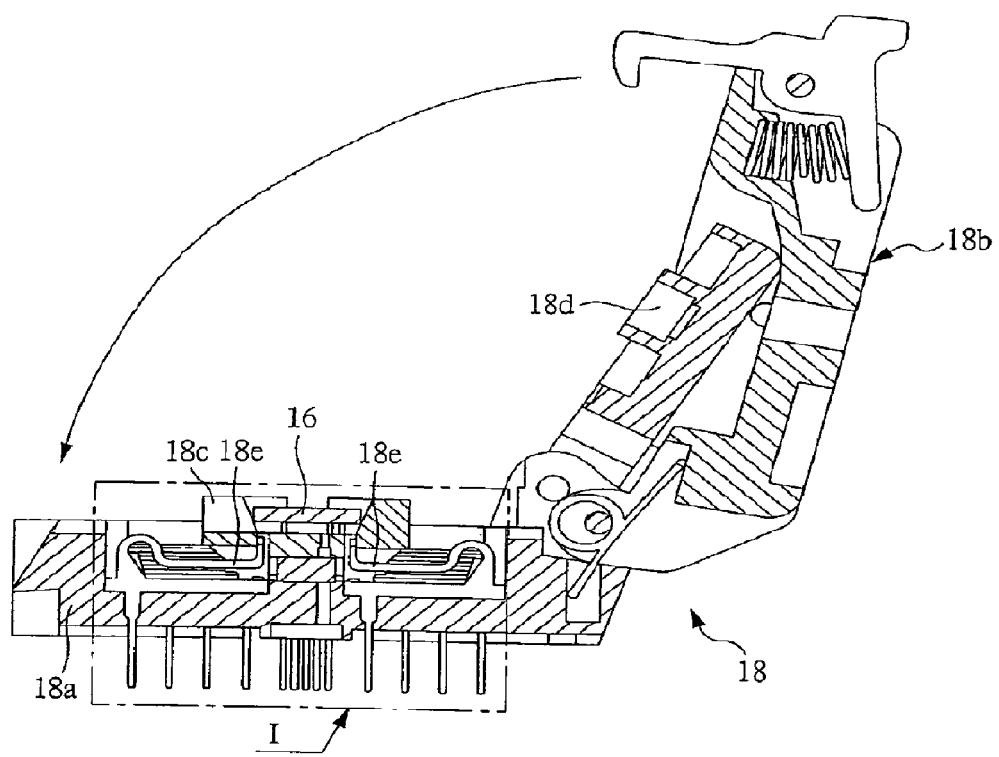
FIG. 56 is a sectional view showing one example of a socket mounting state at a time of an electric characteristic inspection executed after assembly of a QFN according to a fourth embodiment of the present invention.
Figure 57:
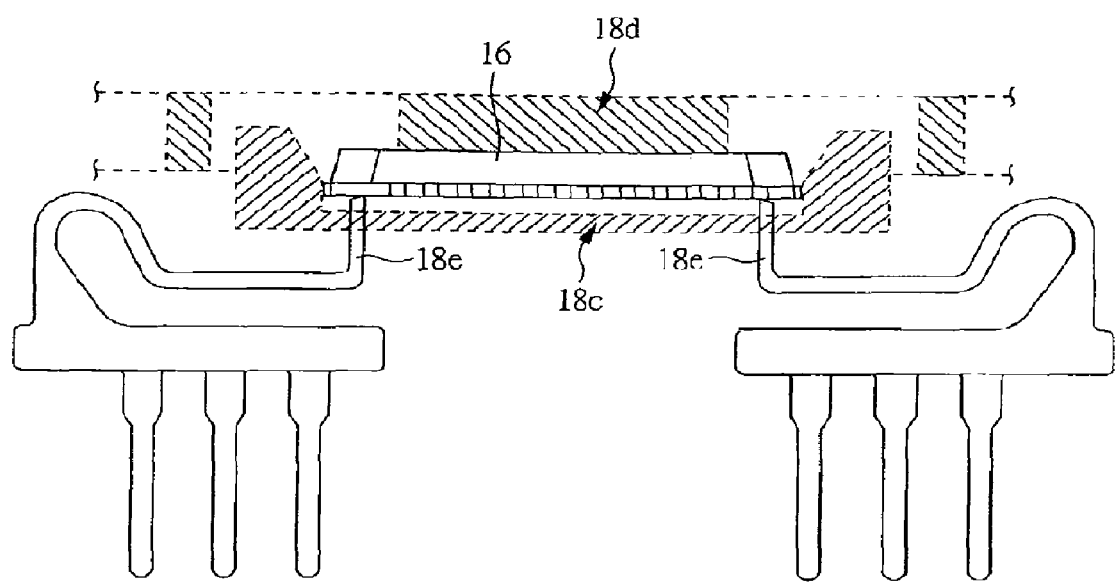
FIG. 57 is an enlarged partial sectional view showing a structure of the "I portion" shown in FIG. 56.

FIGS. 54 and 55 are views showing an electric characteristic inspection for the QFN 16. At a time of the inspection, as shown in FIGS. 56 and 57, the QFN 16 is disposed at a positioning base 18c of a main body 18a of a socket 18 and then, and a lid portion 18b is closed and the QFN 16 is pressed by a package holder 18d to attach the QFN 16 to the socket 18.

Consequently, as shown in FIG. 55, since a contact pin 18e contacts with the mounted surface in of the exposed portion 1p of the tab hanging lead 1e, the electric characteristic inspection can be made.

Figure 58:
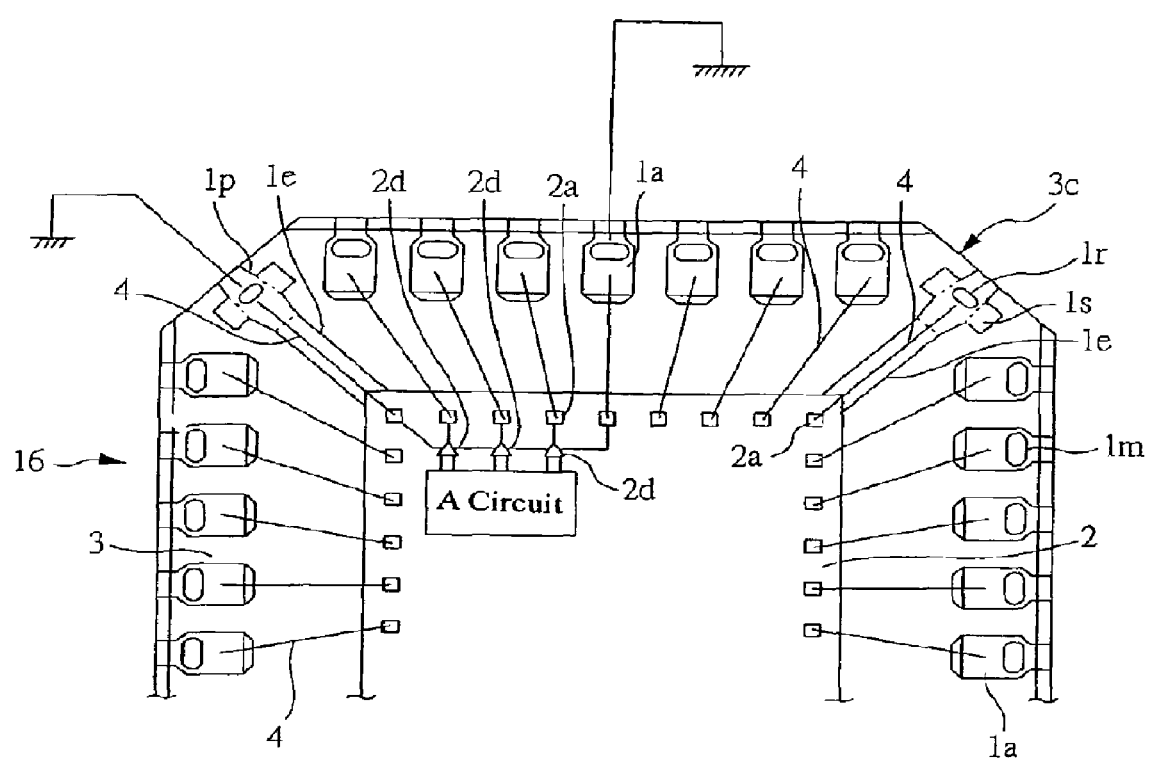
FIG. 58 is a partial plan view showing one example of a supply state of a GND potential at a time of the electric characteristic inspection shown in FIG. 56.

At this time, as shown in FIG. 58, tests are conducted in states in which the GND potential is supplied to a "A circuit" for high frequency through the pad 2a and a high-frequency amplifier 2d from the independent tab lead is for GND and further in which the GND potential is supplied to the "A circuit" for high frequency through the pad 2a and the high-frequency amplifier 2d from the exposed portion 1p of the tab hanging lead 1e, which is a common terminal.

Thus, the GND potential is stabilized by supplying sufficiently the GND potential and the tests is conducted under the condition in which the high-frequency characteristic of the "A circuit" is ensured, so that the high-frequency characteristic of the semiconductor chip 2 can be improved. That is, characteristics of the high-frequency "A circuit" can be tested under circumstances near a state of being actually used as a product.

Note that at the time of mounting the QFN 16 on the socket 18, since contact pins 18e for signal also contact respectively with the leads 1a for signal, the desired electric characteristic inspection is carried out by inputting an electric signal through a predetermined lead 1a as occasion demands.

Fifth Embodiment

Figure 59:
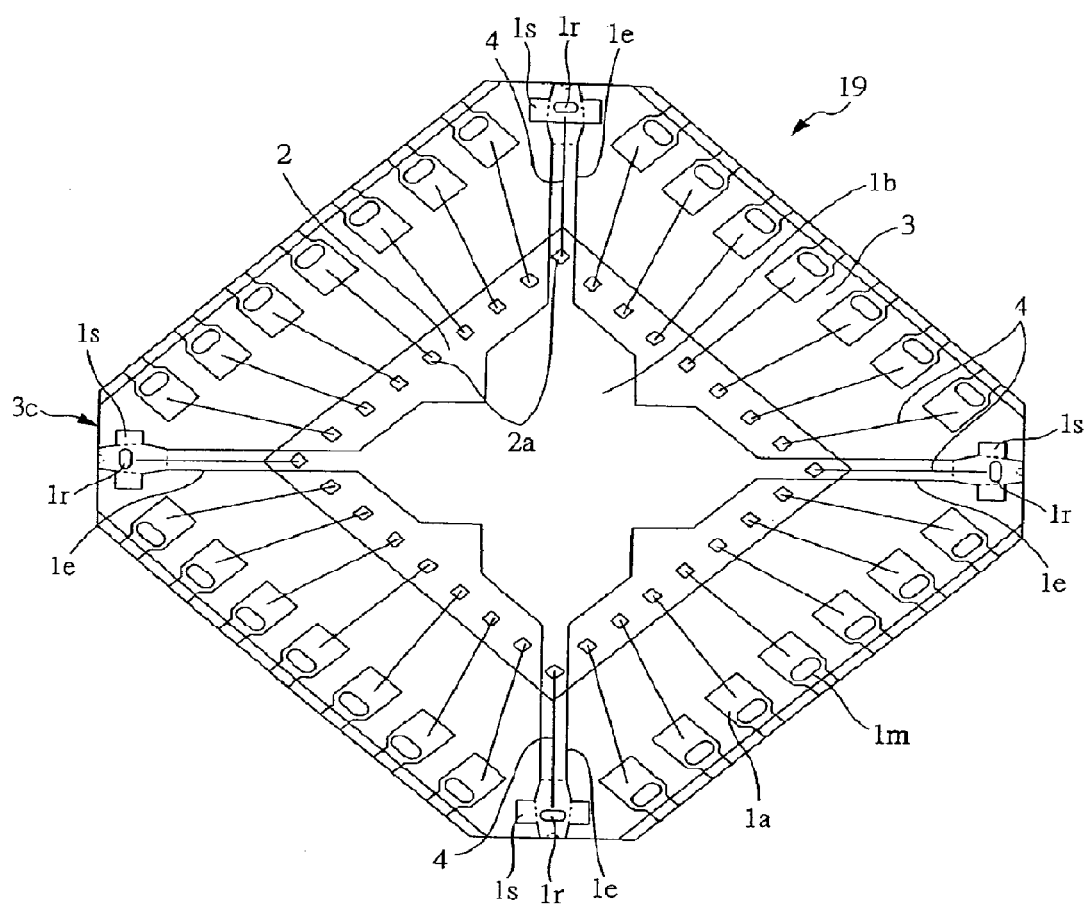
FIG. 59 is a plan view showing, through a sealing portion, one example of structure of a QFN according to a fifth embodiment of the present invention.

FIG. 59 shows a structure of a QFN 19 according to a fifth embodiment. In the QFN 19, the wire 4 is connected to the tab hanging lead 1e, but each lead 1a is such that the relation between the length (P) of the mounted surface 1d and the length (Q) of the sealing-portion forming surface 1g as shown FIG. 2 is not "P>Q" but "P=Q".

That is, the GFN 19 has the structure in which the length of the mounted surface 1d is equal to that of the sealing-portion forming surface 1g.

Even in the QFN 19 having such a structure, the same effects as those of the QFN 16 of the fourth embodiment can be obtained by a technique for connecting the wire 4 to the tab hanging lead 1e or/and a technique for providing the concave portions 1r and 1t and the projecting portion is to the tab hanging lead 1e.

In the foregoing description, the invention made by the present inventors has been specifically described based on the embodiments. However, needless to say, the present invention is not limited to the above-mentioned embodiments and can be variously modified and altered without departing from the gist thereof.

For example, in the first embodiment, the case where the QFN 5 is assembled using the lead frame 1 in which the plurality of package regions (regions surrounded by the cutting portion 1j) as shown in FIG. 7 are formed in matrix arrangement has been described. However, the assembly of the semiconductor device (QFN 5) may be carried out using the stripe-shaped multiple lead frame 1 in which two or more of the above-mentioned package regions are formed in line.

Also, the technique for relaxing the stress applied to the connecting position of the wire 4 by providing the tab hanging lead 1e described in the fourth embodiment with the concave portions 1r and 1t and/or the projecting portion is not limited to the semiconductor device having the QFN structure, and may be a semiconductor device in which the leads 1a extend in two directions opposed to each other if the semiconductor device is of a non-lead type.

INDUSTRIAL APPLICABILITY

As described above, the semiconductor device of the present invention is preferably applied to the non-lead type semiconductor device in which each lead is exposed partially to and disposed on the end portion of the rear surface of the sealing portion, and particularly is preferable applied to a QFN in which the leads extend in four directions.

The invention claimed is:

1. A semiconductor device comprising:
   a chip mounting portion having a chip supporting surface and a back surface opposite to the chip supporting surface;
   a semiconductor chip having a front surface, a plurality of electrodes formed on the front surface, and rear surface opposite to the front surface, and mounted on the chip supporting surface of the chip mounting portion such that the rear surface of the semiconductor chip faces the chip supporting surface of the chip mounting portion;
   a plurality of leads arranged around the chip mounting portion;
   a plurality of wires electrically connecting the electrodes of the semiconductor chip with the leads, respectively; and
   a sealing member sealing the semiconductor chip, the leads and the wires, the sealing member having an upper surface, a lower surface opposite to the upper surface, and a plurality of side surfaces located between the upper surface and the lower surface;
   wherein each of the leads has a sealing surface, a mounting surface opposite to the sealing surface, an inner end surface located between the sealing surface and the mounting surface and facing the chip mounting portion, an outer end surface located between the sealing surface and the mounting surface and opposite to the inner end surface, and lead side surfaces each located between the sealing surface and the mounting surface and located between the inner end surface and the outer end surface, a first inner end part at an intersection of the sealing surface with the inner end surface, and a second inner end part at an intersection of the mounting surface with the inner end surface;
   wherein the wires are connected with the sealing surfaces of the leads, respectively;
   wherein the mounting surface of each lead is exposed from the lower surface of the sealing member;
   wherein the second inner end part is located closer to the chip mounting portion than the first inner end part, in a cross-section view; and
   wherein a width of the sealing surface in an intersecting direction intersecting with an extending direction of each of the leads is wider than that of the mounting surface.

2. The semiconductor device according to claim 1, wherein each of the side surfaces curved.

3. The semiconductor device according to claim 2, wherein the sealing member is formed such that the outer end surface of each of the leads is exposed from a corresponding one of the side surfaces of the sealing member.

4. The semiconductor device according to claim 1, wherein a dimension in a plan view of the chip mounting portion is smaller than a corresponding dimension of the semiconductor chip.

5. The semiconductor device according to claim 1, wherein the back surface of the chip mounting portion is exposed from the lower surface of the sealing member.

6. The semiconductor device according to claim 1, wherein a thickness of the chip mounting portion is less than that of each of the leads; and
   wherein the back surface of the chip mounting portion is covered by the sealing member.

7. The semiconductor device according to claim 1, wherein the chip supporting surface of the chip mounting portion is located at a same level as the sealing surface of each of the leads in the cross-section view.

8. The semiconductor device according to claim 1, wherein a peripheral portion of the rear surface of the semiconductor chip is facing to the inner end surface of each of the leads.

9. The semiconductor device according to claim 1, wherein each of the lead side surfaces is inclined relative to the mounting surface of each of the leads.

* * * * *